US012402421B2

(12) United States Patent
Liu et al.

(10) Patent No.: US 12,402,421 B2
(45) Date of Patent: Aug. 26, 2025

(54) SURFACE UNIFORMITY CONTROL IN PIXEL STRUCTURES OF IMAGE SENSORS

(71) Applicant: Taiwan Semiconductor Manufacturing Company, Ltd., Hsinchu (TW)

(72) Inventors: Po-Chun Liu, Hsinchu (TW); Eugene I-Chun Chen, Taipei (TW); Chun-Kai Lan, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/231,471

(22) Filed: Aug. 8, 2023

(65) Prior Publication Data

US 2023/0395643 A1    Dec. 7, 2023

Related U.S. Application Data

(62) Division of application No. 17/102,623, filed on Nov. 24, 2020.

(Continued)

(51) Int. Cl.
*H10F 39/12* (2025.01)
*H10F 39/00* (2025.01)
(Continued)

(52) U.S. Cl.
CPC ......... *H10F 39/011* (2025.01); *H10F 39/024* (2025.01); *H10F 39/199* (2025.01);
(Continued)

(58) Field of Classification Search
CPC ........... H01L 27/14607; H01L 27/1462; H01L 31/028; H01L 31/02161;
(Continued)

(56) References Cited

U.S. PATENT DOCUMENTS 5,756,396 A    5/1998  Lee et al.
8,257,997 B2 *  9/2012  Chen ................... H01L 31/1808
                                                     257/E31.032

(Continued)

FOREIGN PATENT DOCUMENTS

CN    104835780 A    8/2015
CN    105448863 A    3/2016
(Continued)

*Primary Examiner* — Daniel Luke
(74) *Attorney, Agent, or Firm* — Sterne, Kessler, Goldstein & Fox P.L.L.C.

(57) ABSTRACT

A semiconductor device with an image sensor and a method of fabricating the same are disclosed. The method includes depositing a dielectric layer on a substrate, forming a trench within the dielectric layer and the substrate, forming an epitaxial structure within the trench, and forming a barrier layer with first and second layer portions. The first layer portion is formed on a sidewall portion of the trench that is not covered by the epitaxial structure. The method further includes forming a capping layer on the epitaxial structure and adjacent to the barrier layer, selectively doping regions of the epitaxial structure and the capping layer, selectively forming a silicide layer on the doped regions, depositing an etch stop layer on the silicide layer, and forming conductive plugs on the silicide layer through the etch stop layer.

20 Claims, 42 Drawing Sheets

Related U.S. Application Data

(60) Provisional application No. 63/031,752, filed on May 29, 2020.

(51) Int. Cl.
  *H10F 71/00* (2025.01)
  *H10F 77/122* (2025.01)
  *H10F 77/30* (2025.01)

(52) U.S. Cl.
  CPC ....... *H10F 39/8027* (2025.01); *H10F 39/805* (2025.01); *H10F 71/121* (2025.01); *H10F 77/122* (2025.01); *H10F 77/306* (2025.01)

(58) Field of Classification Search
  CPC ... H01L 31/1808–1816; H10F 39/8027; H10F 39/805
  See application file for complete search history.

(56) References Cited

U.S. PATENT DOCUMENTS

| | | | |
|---|---|---|---|
| 9,799,689 B2 | 10/2017 | Cheng et al. | |
| 9,871,132 B1* | 1/2018 | Liu | H01L 29/7835 |
| 10,861,896 B2 | 12/2020 | Liu et al. | |
| 11,031,425 B2* | 6/2021 | Seo | H01L 27/1462 |
| 2009/0101909 A1* | 4/2009 | Chen | H01L 31/1808 257/65 |
| 2011/0084308 A1 | 4/2011 | Loh et al. | |
| 2015/0228793 A1 | 8/2015 | Chen et al. | |
| 2016/0071799 A1 | 3/2016 | Hsieh et al. | |
| 2017/0092679 A1 | 3/2017 | Wan et al. | |
| 2018/0158850 A1* | 6/2018 | Wu | H01L 27/14621 |
| 2019/0081099 A1 | 3/2019 | Tamaki et al. | |
| 2019/0088700 A1 | 3/2019 | Yang | |
| 2019/0132536 A1 | 5/2019 | Watanabe et al. | |
| 2020/0035741 A1* | 1/2020 | Liu | H01L 27/1464 |
| 2021/0375669 A1 | 12/2021 | Liu et al. | |

FOREIGN PATENT DOCUMENTS

| | | |
|---|---|---|
| CN | 108886045 A | 11/2018 |
| JP | 2013020998 A | 1/2013 |
| KR | 20070056691 A | 6/2007 |
| KR | 20200012816 A | 2/2020 |

* cited by examiner

SURFACE UNIFORMITY CONTROL IN PIXEL STRUCTURES OF IMAGE SENSORS

CROSS-REFERENCE TO RELATED APPLICATIONS

This application is a divisional of U.S. patent application Ser. No. 17/102,623, titled "Surface Uniformity Control in Pixel Structures of Image Sensors," filed Nov. 24, 2020, which claims the benefit of U.S. Provisional Patent Application No. 63/031,752 titled "A Flat Device Structure for IR Sensors," filed May 29, 2020, each of which is incorporated by reference herein in its entirety.

BACKGROUND

Semiconductor image sensors are used to sense incoming visible or non-visible radiation, such as visible light and infrared light. Complementary metal-oxide-semiconductor (CMOS) image sensors (CIS) and charge-coupled device (CCD) sensors are used in various applications, such as digital still cameras, mobile phones, tablets, and goggles. These image sensors utilize an array of pixels that absorb (e.g., sense) the incoming radiation and convert it into electrical signals. An example of an image sensor is a backside illuminated (BSI) image sensor, which detects radiation from a "backside" of a substrate of the BSI image sensor.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
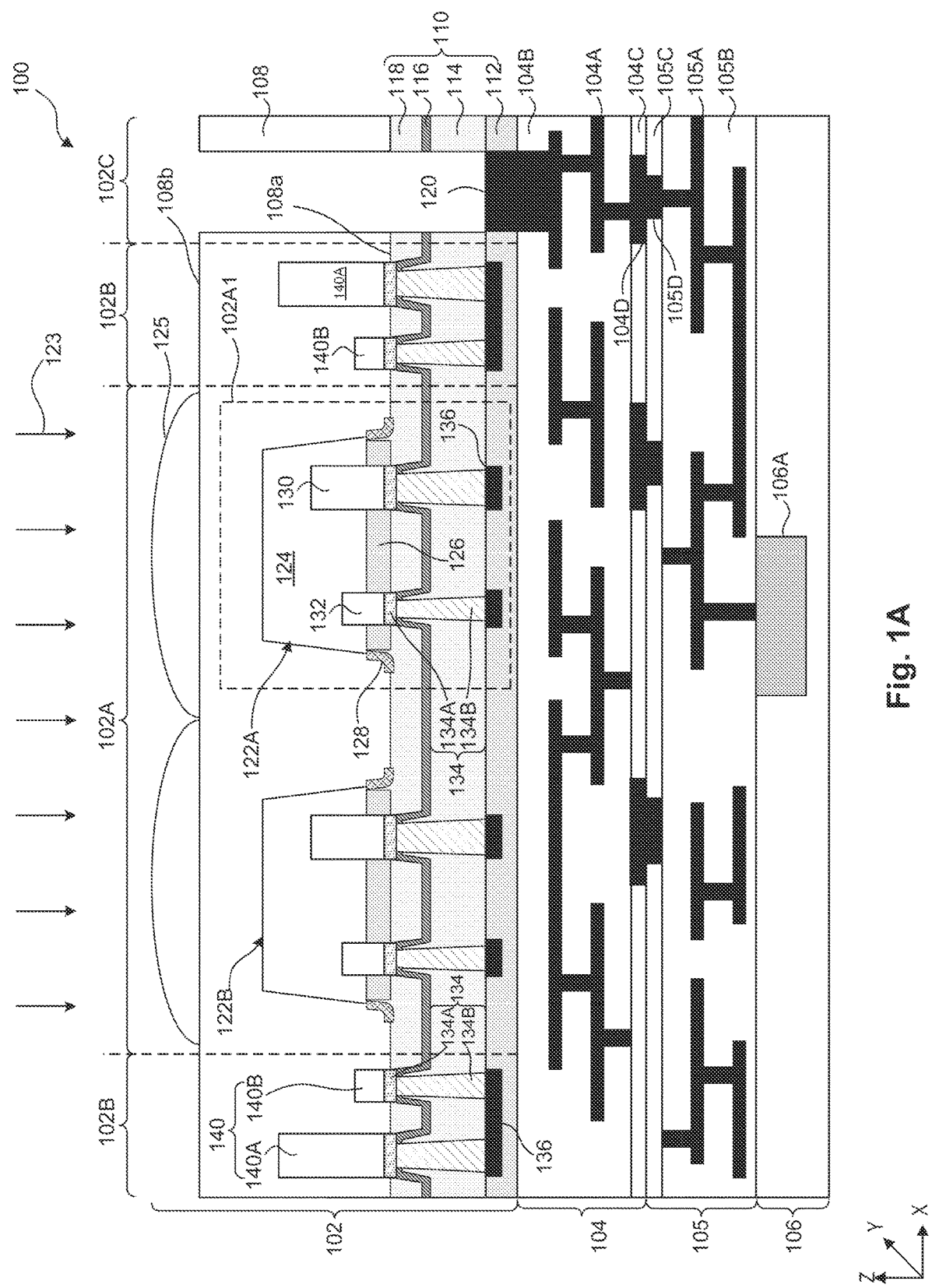
FIG. 1A illustrates a cross-sectional view of a semiconductor device with a BSI image sensor, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

A BSI image sensor (e.g., time-of-flight sensor) includes a pixel region (also referred to as radiation-sensing region") with an array of pixel structures formed on a substrate (e.g., a semiconductor substrate). The pixel structures are configured to receive a radiation (e.g., infra-red radiation) reflected from an object and convert photons from the received radiation to electrical signal. The electrical signal is used to produce a depth image by measuring the phase-delay of the received radiation. The electrical signal is subsequently distributed to processing components attached to the BSI image sensor. For this reason, the pixel structures overlie a multi-level metallization layer configured to distribute the electrical signal generated within the pixel structures to appropriate processing components.

The multi-level metallization layer is coupled to a first surface of the substrate, which is also referred to as the "front side" surface of the substrate. The pixel structures are formed on the front side surface of the substrate and the radiation is received by the pixel structures through a second surface of the substrate that is opposite to the front side surface of the substrate. This second surface of the substrate is also referred to as the "back side" surface of the substrate. Each of the pixel structures includes a germanium (Ge) or silicon germanium (SiGe) epitaxial structure disposed within the substrate, a silicon capping layer disposed on the Ge or SiGe epitaxial structure, and doped regions disposed within the Ge or SiGe epitaxial structure and the silicon capping layer. The silicon capping layers passivate the Ge or SiGe epitaxial structures and provide silicon atoms for the formation of silicide structures on the doped regions.

The BSI image sensor can be electrically coupled to external devices (e.g., an external circuitry) through wire connectors attached to pad structures formed on the back side surface of the substrate. To achieve this, the pad structures of the BSI image sensor extend from the back side surface of the substrate to the front side surface of the substrate and electrically connect to the multi-level metallization layer. Accordingly, the multilevel metallization layer, which provides electrical signal connection to the BSI image sensor can be electrically connected to an external device or circuit through the pad structures. The pad structures can be disposed at the periphery of the BSI image sensor around the pixel region.

A challenge with BSI image sensors is reducing or eliminating dark current, which is induced by surface non-uniformity of the Ge or SiGe epitaxial structures formed on the front side surface of the substrate. The dark current is an electrical current that passes through the Ge or SiGe epitaxial structures even when no photons are received by the BSI image sensors. The dark current generation source is the non-uniform interfaces between the Ge or SiGe epitaxial structures and the silicon capping layers that induce charge carriers (e.g., holes) to accumulate at the non-uniform interfaces. Such dark current causes the Ge or SiGe epitaxial structures to generate electrical signals that do not correspond to the actual amount of the radiation received by the BSI image sensors. As a result, the dark current degrades the performance of the BSI image sensors in accurately determining the distance of the object from the BSI image sensor.

The surface non-uniformity, such as recesses, are formed near the edges of the Ge or SiGe epitaxial structures as a result of surface deformation in the Ge or SiGe epitaxial structures caused by the high temperature (e.g., temperature greater than 500° C.) processing of overlying layers, such as the silicon capping layers. The high temperature can cause the Ge or SiGe materials near the edges of the Ge or SiGe epitaxial structures to become ductile and laterally flow to form Ge or SiGe layers over the edges of the trenches in which the Ge or SiGe epitaxial structures are formed. These trench edges can be substrate edges on the front side surface of the substrate. The non-uniform surfaces can also lead to the formation of gaps in the overlying layers formed on the Ge or SiGe epitaxial structures. These gaps can introduce processing chemicals (e.g., etching solutions) into the Ge or SiGe epitaxial structures during the processing of the overlying layers and damage the Ge or SiGe epitaxial structures.

The present disclosure provides example methods of fabricating BSI image sensors with improved surface uniformity of Ge or SiGe epitaxial structures in pixel structures. In some embodiments, the example methods form barrier layers at the edges of the trenches in which the Ge or SiGe epitaxial structures are formed. The barrier layers can prevent the formation of Ge or SiGe layers at the trench edges because the barrier layers include dielectric materials, such as silicon oxide ($SiO_x$), that are not favorable for the growth of Ge or SiGe layers. The materials of the barrier layers can inhibit the growth of Ge or SiGe layers on the barrier layers, and as a result, inhibits the growth of Ge or SiGe layers at the trench edges. Preventing the lateral expansion of the materials of the Ge or SiGe epitaxial structures can prevent the formation of recesses on the surfaces of the Ge or SiGe epitaxial structures.

Thus, the barrier layers at the trench edges can minimize or eliminate surface non-uniformity, and consequently reduce or eliminate the formation of non-uniform interfaces between the Ge or SiGe epitaxial structures and silicon capping layers. In some embodiments, the surface non-uniformity in the Ge or SiGe epitaxial structures is reduced by about 50% to about 100% compared to epitaxial structures in BSI image sensors without the barrier layers. As a result, the sensor performance of the BSI image sensors with the barrier layers is increased by about 40% to about 60% compared to BSI image sensors without the barrier layers at the trench edges.

A semiconductor device 100 having a BSI image sensor 102, a first a multi-level metallization layer 104, a second a multi-level metallization layer 105, and an application specific integrated circuit (ASIC) 106 is described with reference to FIGS. 1A-1F, according to some embodiments. FIG. 1A illustrates a cross-sectional view of semiconductor device 100, according to some embodiments. FIGS. 1B-1F illustrate enlarged cross-sectional views of region 102A1 of BSI image sensor 102 in FIG. 1A, according to various embodiments. The discussion of elements in FIGS. 1A-1D with the same annotations applies to each other, unless mentioned otherwise.

Referring to FIG. 1A, BSI image sensor 102 can be disposed on and electrically coupled to first multi-level metallization layer 104. First multi-level metallization layer 104 can be disposed on second a multi-level metallization layer 105, which can be disposed on and electrically coupled to ASIC 106. First multi-level metallization layer 104 can include a multi-level interconnect structure 104A embedded in an inter-metal dielectric (IMD) layer 104B, which is disposed on a bonding layer 104C with metal lines 104D. Similarly, second multi-level metallization layer 105 can include a multi-level interconnect structure 105A embedded in an IMD layer 105B and a bonding layer 105C with metal lines 105D disposed on IMD layer 105B. Bonding layers 104C-105C can be bonded to each other by a suitable bonding method, such as direct bonding, eutectic bonding, hybrid bonding, and optical fusion bonding, and can be electrically connected to each other through metal lines 104D-105D. As a result, BSI image sensor 102 can be electrically connected to ASIC 106 through first and second multi-level metallization layers 104-105. ASIC 106 can include active devices 106A (e.g., transistor structures) to form logic and memory circuits. In some embodiments, active devices 106A can be configured to process electrical signals received from BSI image sensor 102.

BSI image sensor 102 can be formed on a substrate 108 with a front side surface 108a and a back side surface 108b. In some embodiments, substrate 108 can include a monocrystalline silicon substrate. In some embodiments, substrate 108 can include a semiconductor material, such as Si, Ge, SiGe, silicon carbide (SiC), indium phosphide (InP), gallium arsenide (GaAs), silicon arsenide (SiAs), gallium phosphide (GaP), indium phosphide (InP), silicon germanium carbide (SiGeC), germanium stannum (GeSn), silicon germanium stannum (SiGeSn), gallium arsenic phosphide (GaAsP), gallium indium phosphide (GaInP), gallium indium arsenide (GaInAs), gallium indium arsenic phosphide (GaInAsP), and any other suitable semiconductor material. In some embodiments, substrate 108 can include a silicon-on-insulator (SOI) structure or a germanium-on-insulator (GOI)

structure. Other suitable materials for substrate 108 are within the scope of the present disclosure.

Referring to FIG. 1A, BSI image sensor 102 can include a stack of layers 110 disposed between front side surface 108a and first multi-level metallization layer 104. In some embodiments, stack of layers 110 can include (i) a passivation layer 112 disposed on multi-level metallization layer 104, (ii) an interlayer dielectric (ILD) layer 114 disposed on passivation layer 112, (iii) an etch stop layer (ESL) 116 disposed on ILD layer 114, and (iv) a dielectric layer 118 disposed on ESL 116. BSI image sensor 102 can further include a pixel region 102A, isolation regions 102B, and a contact pad region 102C, according to some embodiments.

In some embodiments, pixel region 102A can include an array of pixel structures 122A-122B. Though an array of two pixel structures 122A-122B are shown, BSI image sensor 102 can have any number of pixel structures arranged in a one-dimensional array or a two-dimensional array. Pixel structures 122A-122B are configured to receive incident radiation beams 123 through microlens 125 on back side surface 108b and convert radiation beams 123 to an electrical signal. The electrical signal is distributed by pad structure 120 and first and second multi-level metallization layers 104-105 to ASIC 106 and/or other external circuits.

In some embodiments, BSI image sensor 102 can be a time-of-flight sensor configured to determine the distance of an object from BSI image sensor 102 based on the known speed of light. For example, a light pulse generator (not shown) disposed on or near the BSI image sensor can project a light pulse (e.g., near infra-red radiation) on the object and the light pulse reflected by the object can be detected by pixel structures 122A-122B. Based on the time difference between the projection time of the light pulse and the detection time of the reflected light pulse, the distance of the object from BSI image sensor 102 can be determined.

Pixel structures 122A-122B are electrically isolated from each other by dielectric layer 118 and are protected by passivation layer 112, ILD layer 114, and ESL 116 during fabrication of BSI image sensor 102. In some embodiments, dielectric layer 118 can include a nitride layer, an oxide layer, an oxynitride layer, or a suitable dielectric material. In some embodiments, dielectric layer 118 can include an oxide of a material of substrate 108, such as silicon oxide ($SiO_x$). In some embodiments, ESL 116 can include a nitride layer, an oxide layer, an oxynitride layer, a carbide layer, or a suitable dielectric material. In some embodiments, ESL 116 can include silicon nitride (SiNx), silicon oxide (SiOx), silicon oxynitride (SiON), silicon carbide (SiC), silicon carbonitride (SiCN), boron nitride (BN), silicon boron nitride (SiBN), silicon carbon boron nitride (SiCBN), or a combination thereof. In some embodiments, ILD layer 114 can include a low-k dielectric layer (e.g., a dielectric with a dielectric constant less than about 3.9), an ultra-low-k dielectric layer (e.g., a dielectric with a dielectric constant less than about 2.5), or an oxide layer (e.g., silicon oxide ($SiO_x$)). In some embodiments, passivation layer 112 can include a nitride layer, an oxide layer, an oxynitride layer, a polymer layer (e.g., polyimide or polybenzoxazole), or a combination thereof.

Figure 1B:
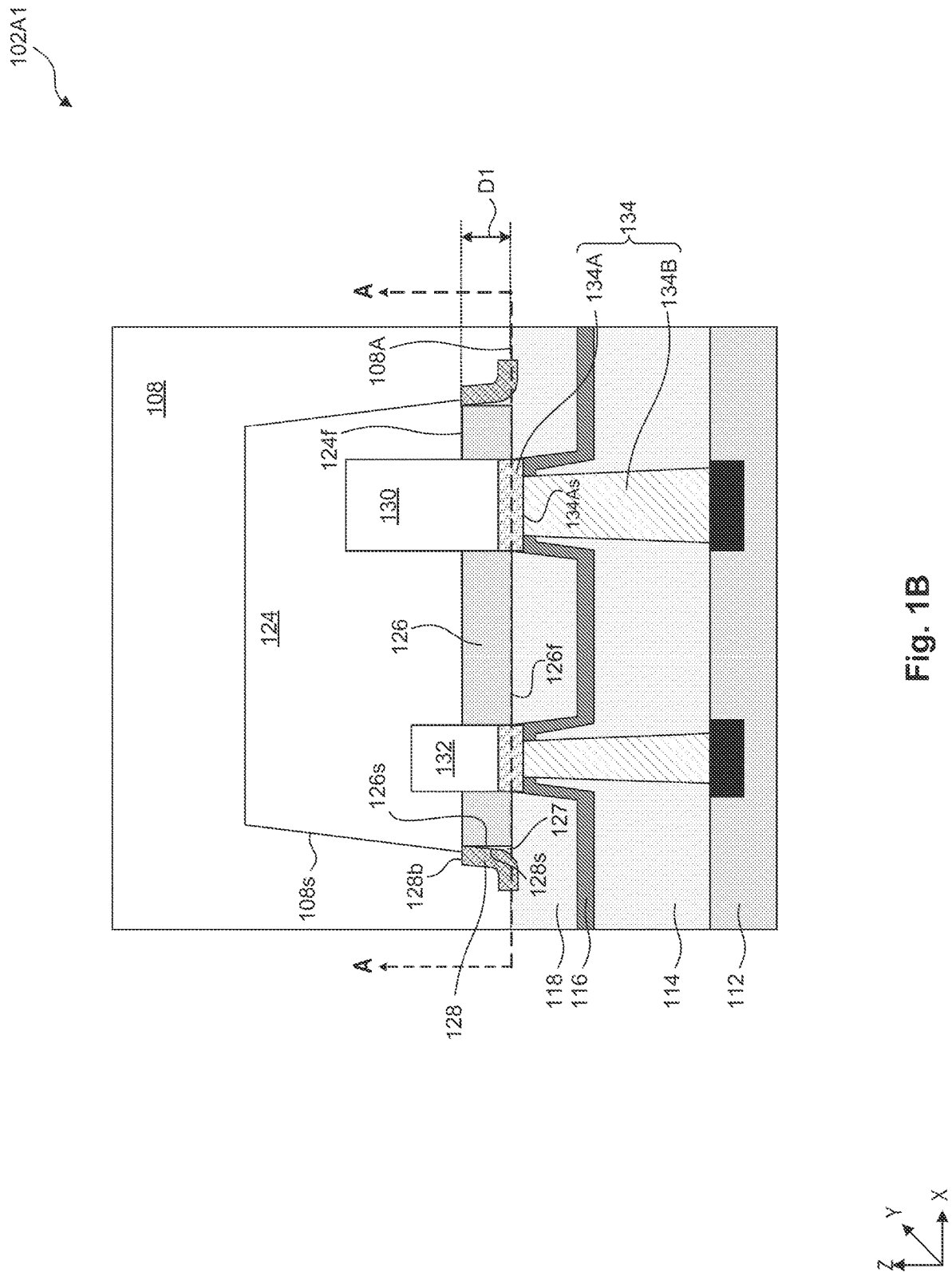
FIGS. 1B-1F illustrate cross-sectional views of pixel structures of a BSI image sensor, in accordance with some embodiments.
Figure 1C:
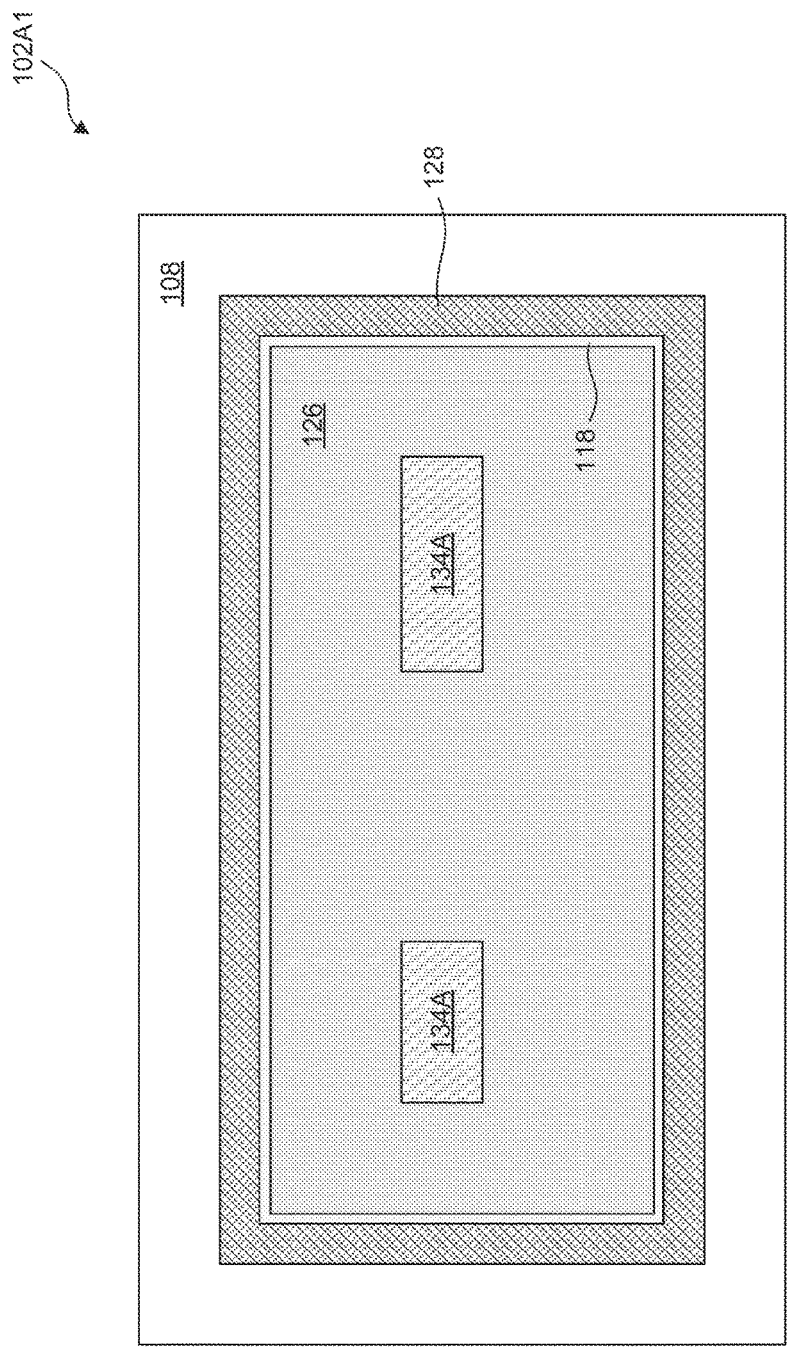
Figure 1C:
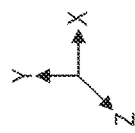
Figure 1D:
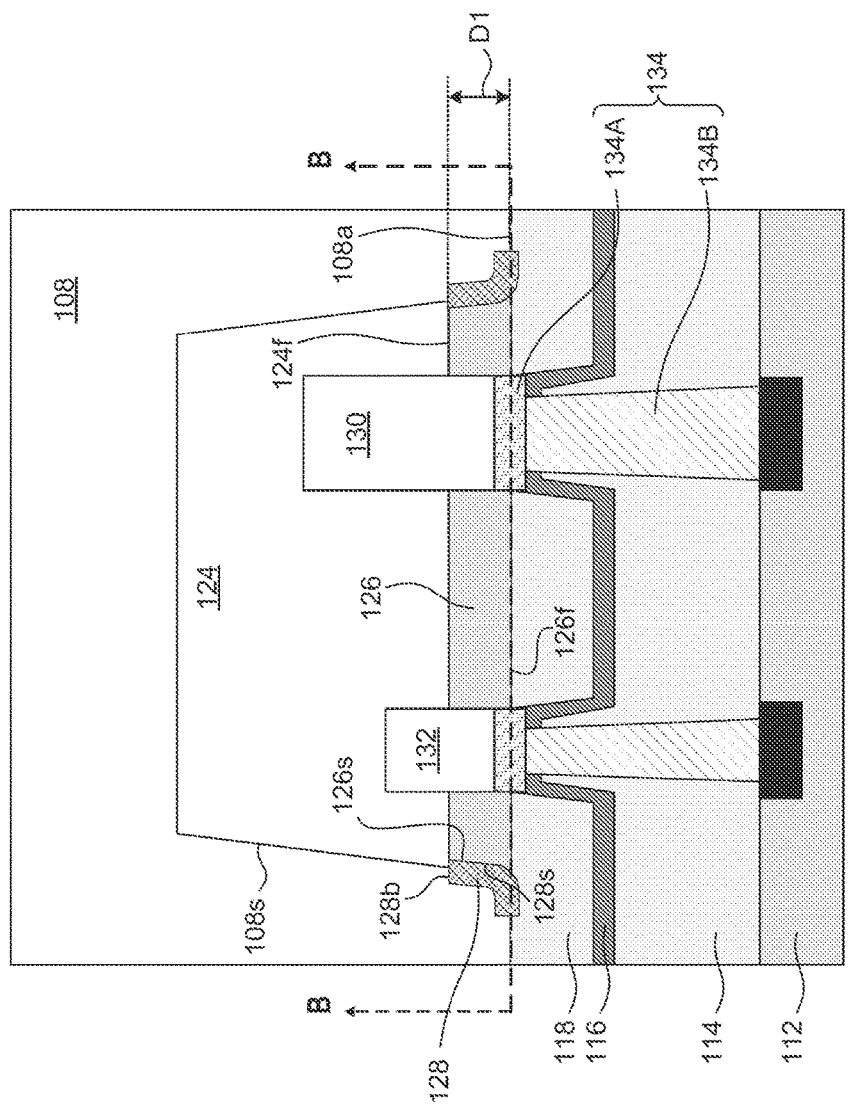
Figure 1E:
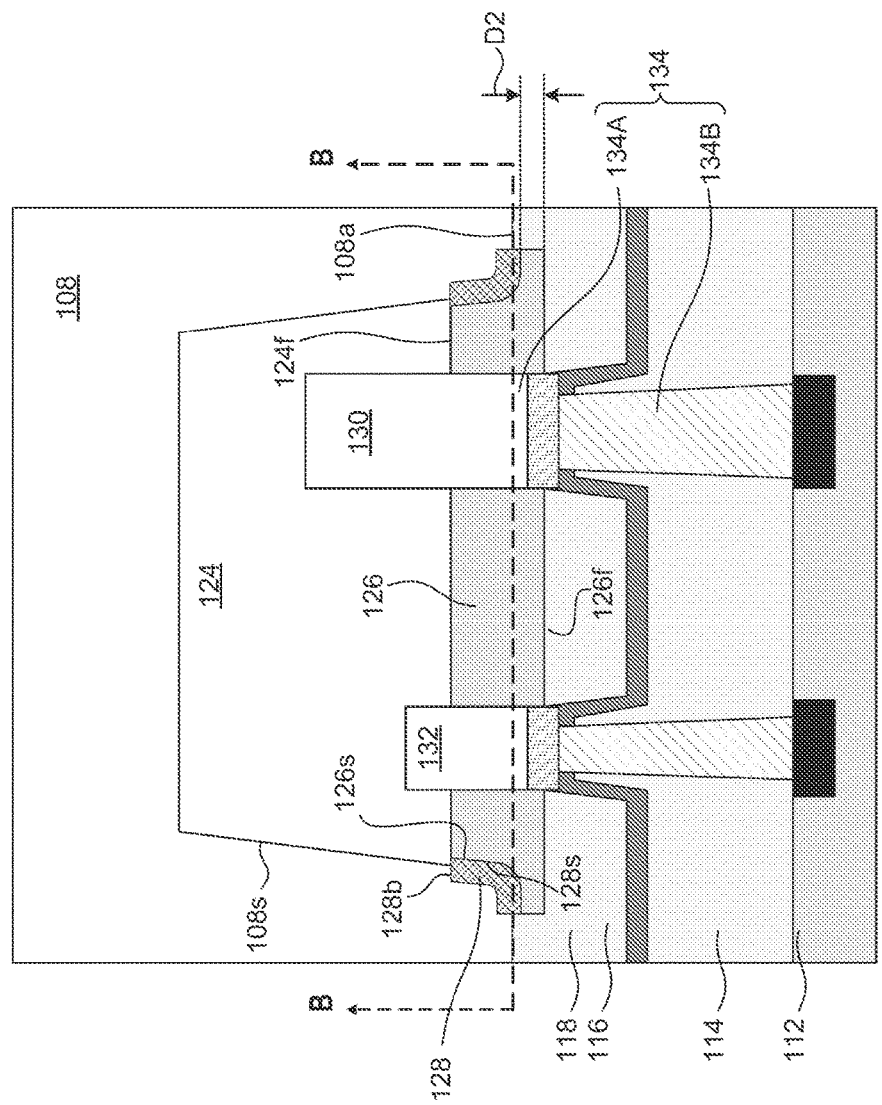
Figure 1F:
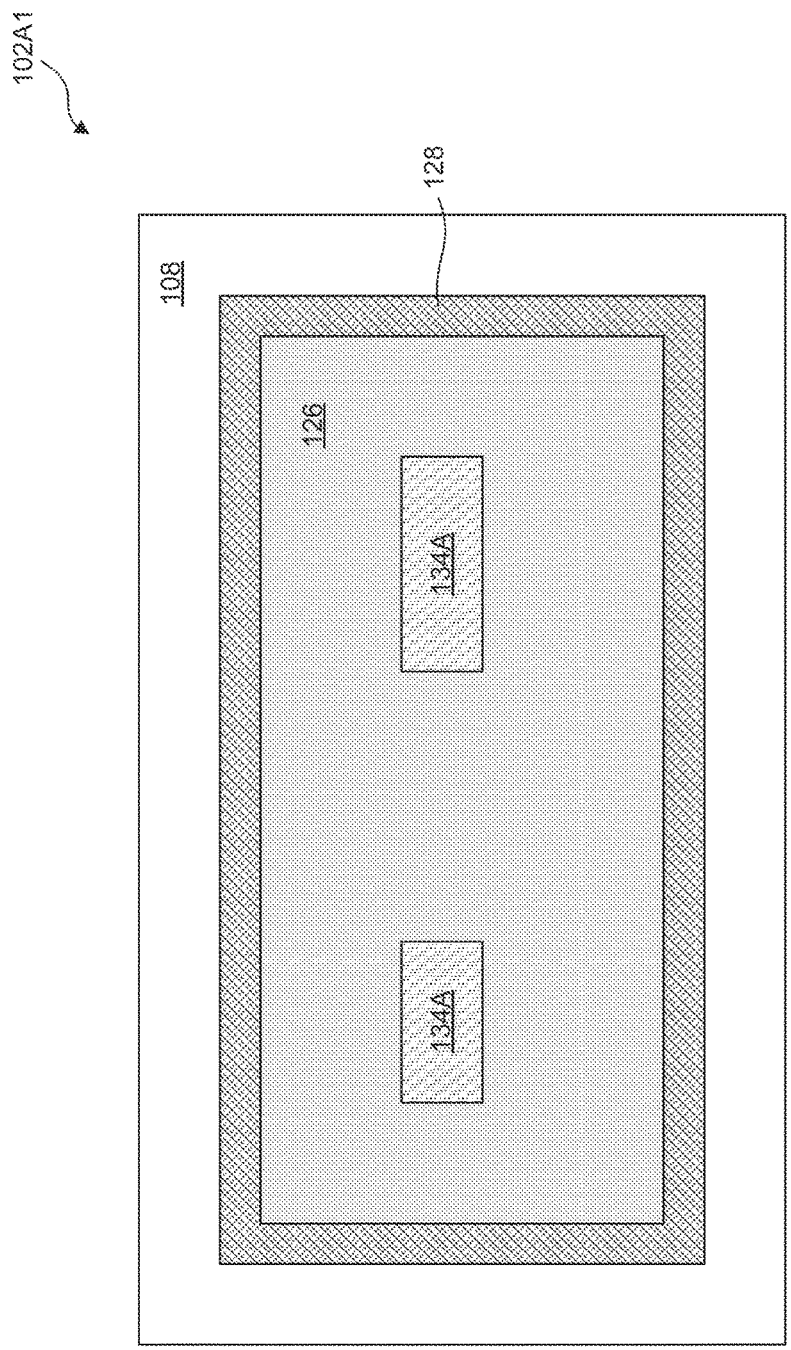

In some embodiments, pixel structures 122A-122B are similar to each other in structure and composition. The discussion of pixel structure 122A applies to pixel 122B, unless mentioned otherwise. Pixel structure 122A is described with reference to FIGS. 1A-1F, according to some embodiments. Pixel structure 122A can have different cross-sectional views as illustrated in FIGS. 1B-1F, according to various embodiments. FIGS. 1B and 1D-1E illustrate enlarged cross-sectional views of pixel structure 122A within region 102A1 of FIG. 1A, according to various embodiments. FIG. 1C illustrates a cross-sectional view along line A-A and XY-plane of FIG. 1B and FIG. 1F illustrates a cross-sectional view along line B-B and XY-plane of FIGS. 1D-1E. The cross-sectional views of FIGS. 1C and 1F are referred to as "front side views" of pixel structure 122A.

Referring to FIGS. 1A-1F, in some embodiments, pixel structure 122A can include (i) an epitaxial structure 124 disposed within substrate 108, (ii) a capping layer 126 disposed on epitaxial structure 124, (iii) a barrier layer 128 disposed on the edges (not visible in FIGS. 1A-1C; discussed in further details below) of substrate 108 adjacent to and surrounding epitaxial structure 124 and capping layer 126, (iv) p-type doped regions 130 disposed within epitaxial structure 124 and capping layer 126, (v) n-type doped region 132 disposed within epitaxial structure 124 and capping layer 126, (vi) contact structures 134 disposed on p- and n-type doped regions 130-132, and (vii) via structures 136 disposed on contact structures 134.

Epitaxial structure 124 can be formed on front side surface 108a and can include a group IV element (e.g., Si, Ge, etc.) of the periodic table. In some embodiments, epitaxial structure 124 can include a group IV element that is different from a group IV element of substrate 108. In some embodiments, epitaxial structures 124 can include undoped Ge or SiGe. In some embodiments, front side surface 124f of epitaxial structure 124 can be spaced apart from front side surface 108a of substrate 108 by a distance D1 along a Z-axis. Distance D1 can range from about 50 nm to about 100 nm or can be other suitable dimensions.

Capping layer 126 can include a group IV element (e.g., Si) of the periodic table that is different from the element included in epitaxial structure 124. The element included in capping layer 126 can have a band gap different from the band gap of the element included in epitaxial structure 124, which results in band discontinuity between epitaxial structure 124 and capping layer 126 (e.g., a difference between the minimum conduction band energy and/or the maximum valence band energy of epitaxial structure 124 and capping layer 126). In some embodiments, front side surface 126f of capping layer 126 can be substantially coplanar with front side surface 108a of substrate 108, as shown in FIGS. 1B and 1D, can be at an XY-plane higher than that of front side surface 108a (not shown), or can be at an XY-plane lower than that of front side surface 108a, as shown in FIG. 1E. In some embodiments, capping layer 126 can extend over barrier layer 128 by a distance D2 along a Z-axis, as shown in FIG. 1E. Distance D2 can range from about 5 nm to about 10 nm or can be other suitable dimensions.

The profiles of sidewalls 126s of capping layer 126 can depend on the method of forming capping layer 126. In some embodiments, sidewalls 126s can have profiles as shown in FIG. 1B when capping layer 126 is grown on epitaxial structure 124 by an epitaxial process. Sidewalls 126s of epitaxially grown capping layer 126 and sidewalls 128s of barrier layer 128 are in physical contact at and near front side surface 124f. But as sidewalls 126s and 128s extend towards front side surface 126f, sidewalls 126s and 128s can become spaced apart from each other by a gap 127 (also referred to as dielectric material-filled gap 127), which is filled with a portion of dielectric layer 118, as shown in FIGS. 1B-1C. Gap 127 can be formed because the material of barrier layer 128 inhibits the epitaxial growth of capping layer 126 on barrier layer 128. In some embodiments, sidewalls 126s can have profiles as shown in FIGS. 1D-1E when capping layer 126 is formed on epitaxial structure 124 by a deposition process. The profiles of sidewalls 126s of deposited capping layer 126 can follow the profiles of sidewalls 128s, as shown in FIGS. 1D-1E.

Figure 29:
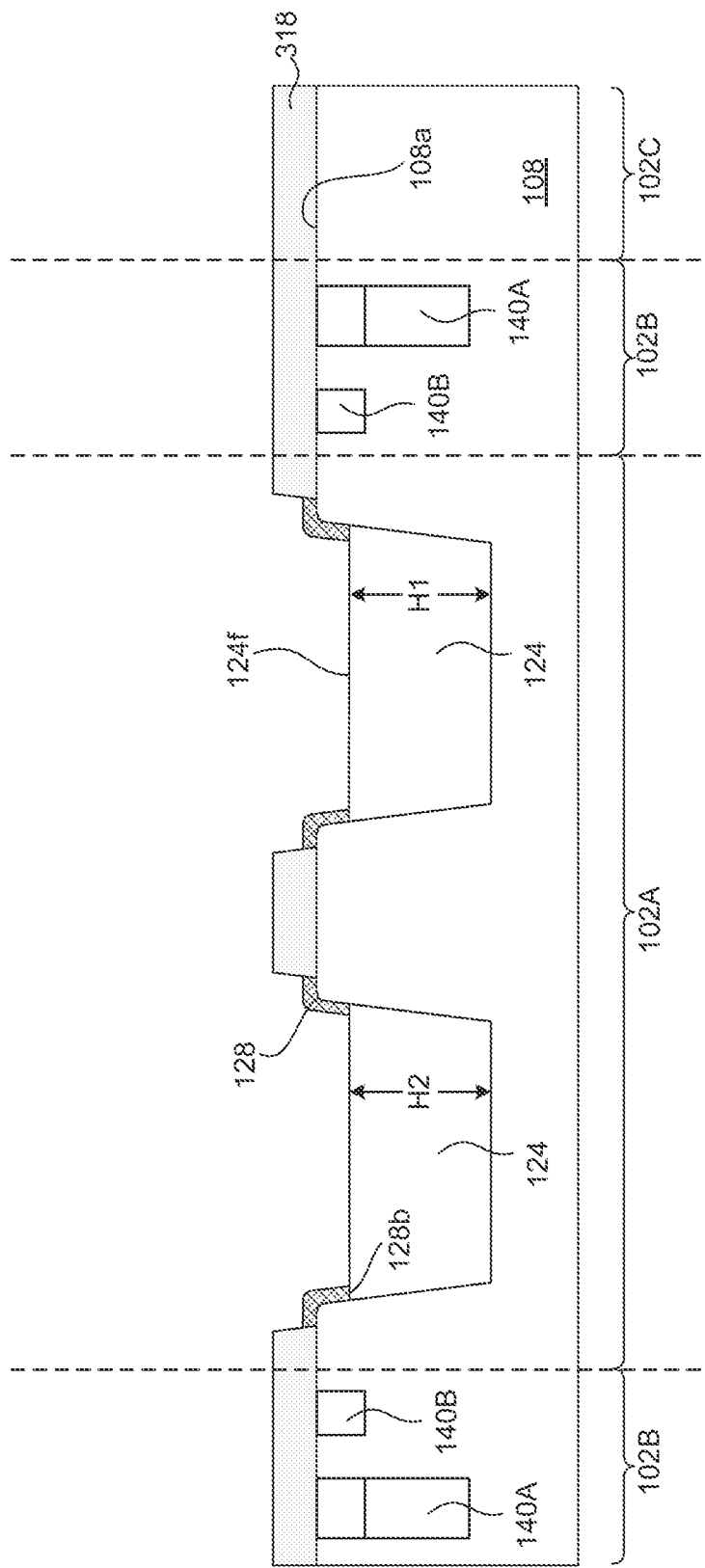
Figure 30:
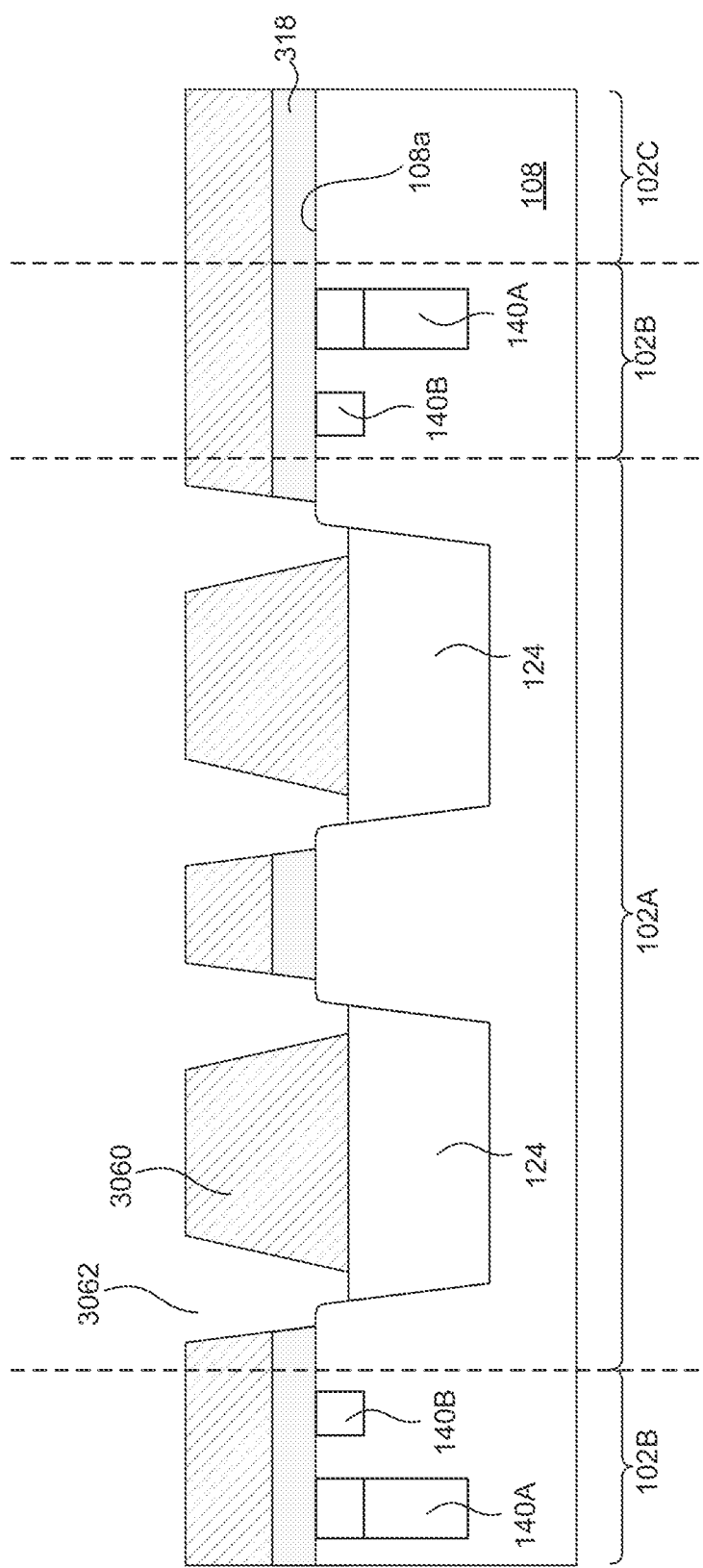
Figure 31:
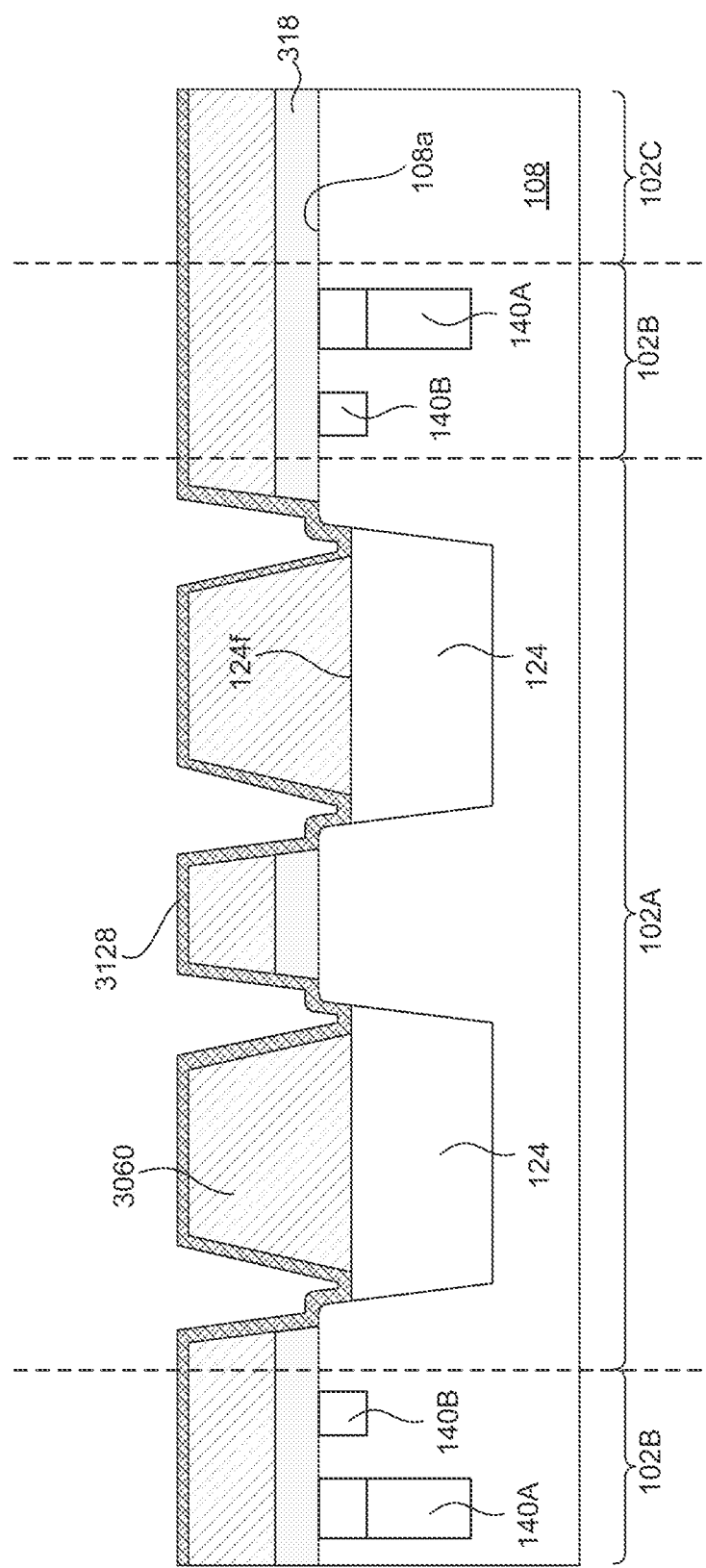
Figure 33:
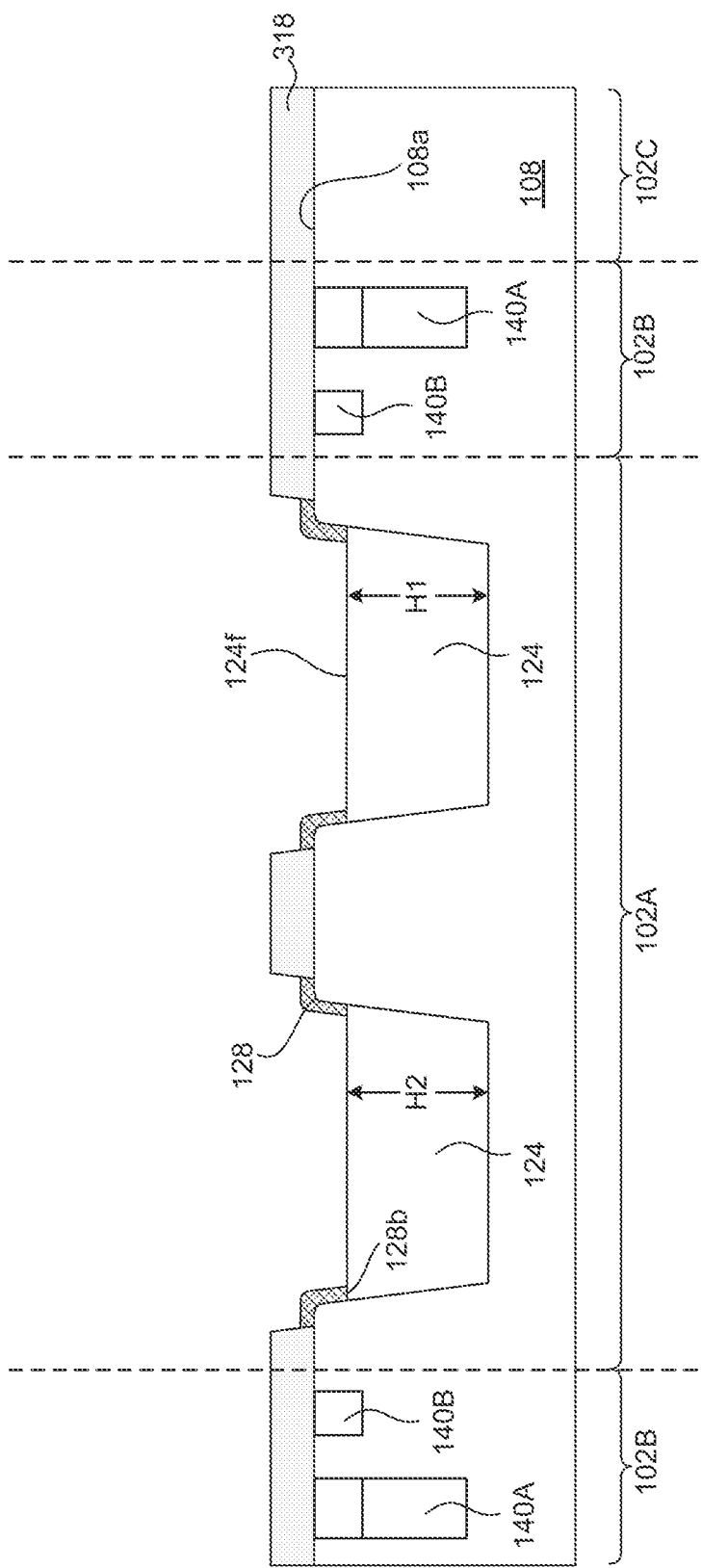

Barrier layer 128 can include an oxide of the material of substrate 108 (e.g., $SiO_x$) or a suitable dielectric material. In some embodiments, barrier layer 128 can be formed at the edges of front side surface 108a surrounding capping layer 126. A portion of barrier layer 128 can extend along a portion of front side surface 108a and along a portion of sidewall 108s of substrate 108. Surfaces 128b of barrier layer 128 can be partially disposed on top edges of epitaxial structure 124, as shown in FIGS. 1B and 1D-1E, when barrier layer 128 is grown on substrate 108 by an oxidation process. On the other hand, surfaces 128b of barrier layer 128 can be fully disposed on top edges of epitaxial structure 124, as shown in FIGS. 29 and 33, when barrier layer 128 is formed by a deposition process. In some embodiments, barrier layer 128 can have a thickness along an X-axis ranging from about 0.5 nm to about 5 nm. Thickness of barrier layer 128 below 0.5 nm may not adequately prevent the deformation of epitaxial structure 124 during subsequent high temperature processes. On the other hand, if thickness is above 5 nm, the processing time (e.g., deposition time or oxidation time) of barrier layer increases, and consequently increases device manufacturing cost.

Contact structures 134 can be configured to electrically connect epitaxial structure 124 to first multi-level metallization layer 104 through via structures 136. Each of contact structures 134 can include a silicide layer 134A and a contact plug 134B. Silicide layers 134A are disposed on p- and n-type doped regions 130-132 and within capping layer 126. Surfaces 134As of silicide layers 134A can be substantially coplanar (not shown) with front side surface 126f of capping layer 126 or can extend below front side surface 126f, as shown in FIGS. 1A-1B and 1D-1E. In some embodiments, silicide layers 134A can include nickel silicide (NiSi), tungsten silicide ($WSi_2$), titanium silicide ($TiSi_2$), cobalt silicide ($CoSi_2$), or a suitable metal silicide. Contact plugs 134B are disposed on silicide layers 134A and within ILD layer 114. In some embodiments, contact plugs 134B can include conductive materials, such as ruthenium (Ru), iridium (Ir), nickel (Ni), Osmium (Os), rhodium (Rh), aluminum (Al), molybdenum (Mo), tungsten (W), cobalt (Co), copper (Cu), and any suitable metallic material. Via structures 136 are disposed on contact plugs 134B and within passivation layer 112. In some embodiments, via structures 136 can include conductive materials, such as Ru, Co, Ni, Al, Mo, W, Ir, Os, Cu, Pt, and any other suitable metallic material.

Referring to FIG. 1A, isolation regions 102B can include n-type doped regions 140 and p-type doped regions 141 that are configured to form PN junction based isolation structures. The isolation structures can be electrically connected to first multi-level metallization layer 104 and/or other circuits through contact structures 134 and via structures 136. Contact pad region 102C can include a pad structure 120 and one or more conductive bonding pads or solder bumps (not shown) on pad structure 120 through which electrical connections between BSI image sensor 102 and external circuit can be established. Pad structure 120 is an input/output (I/O) port of BSI image sensor 102 and includes a conductive layer that is electrically coupled to multi-level interconnect structure 104A.

Figure 2:
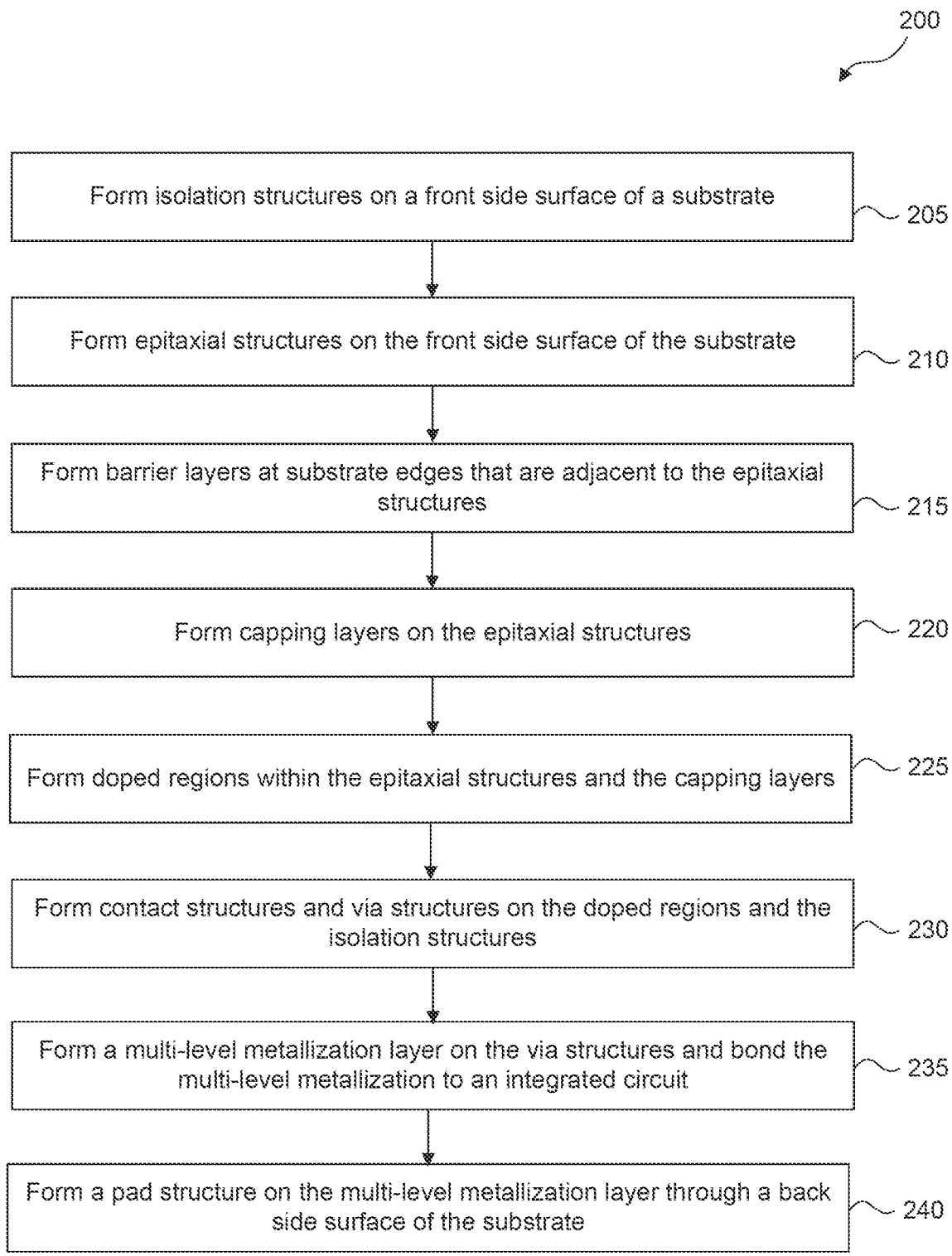
FIG. 2 is a flow diagram of a method for fabricating a semiconductor device with a BSI image sensor, in accordance with some embodiments.

FIG. 2 is a flow diagram of an example method 200 for fabricating semiconductor device 100, according to some embodiments. For illustrative purposes, the operations illustrated in FIG. 2 will be described with reference to the example fabrication process for semiconductor device 100 as illustrated in FIGS. 3-33. FIGS. 3-33 are cross-sectional views of semiconductor device 100 at various stages of fabrication, according to some embodiments. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Elements in FIGS. 3-33 with the same annotations as elements in FIGS. 1A-1F are described above.

Figure 3:
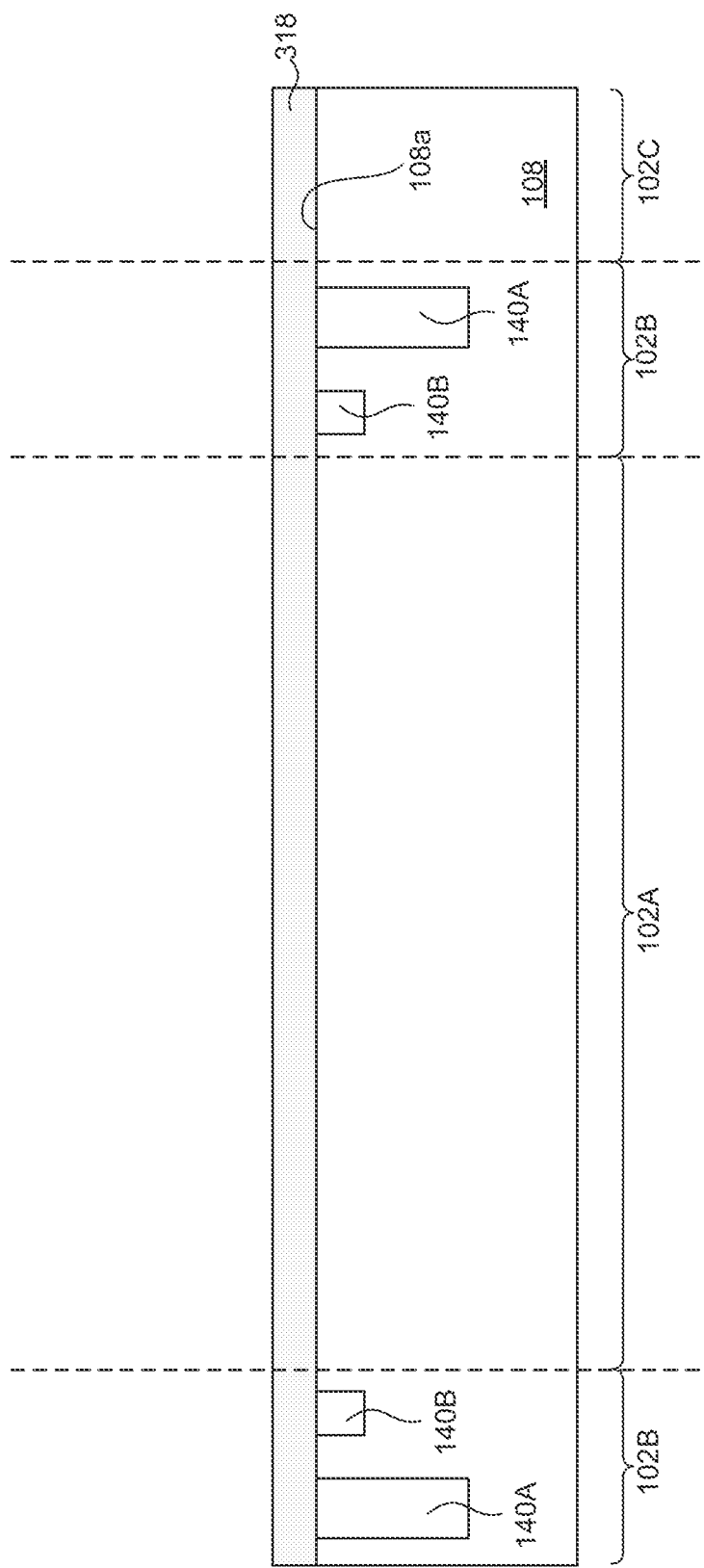
FIGS. 3-37 illustrate cross-sectional views of a semiconductor device with a BSI image sensor at various stages of its fabrication process, in accordance with some embodiments.

In operation 205, isolation structures are formed on a front side surface of a substrate. For example, as shown in FIG. 3, n-type doped regions 140A and p-type doped regions 140B of isolation structures 140 are formed on front side surface 108a of substrate 108. N- and p-type doped regions 140A-140B can be formed by ion implanting dopants into substrate 108 through front side surface 108a. Following the formation of doped regions 140A-140B, a dielectric layer 318 can be deposited on front side surface 108a, as shown in FIG. 3. Dielectric layer 318 can include a material of dielectric layer 118. The formation of dielectric layer 318 can include using a CVD process, an ALD process, a thermal oxidation process, or a suitable deposition process for dielectric materials.

Figure 4:
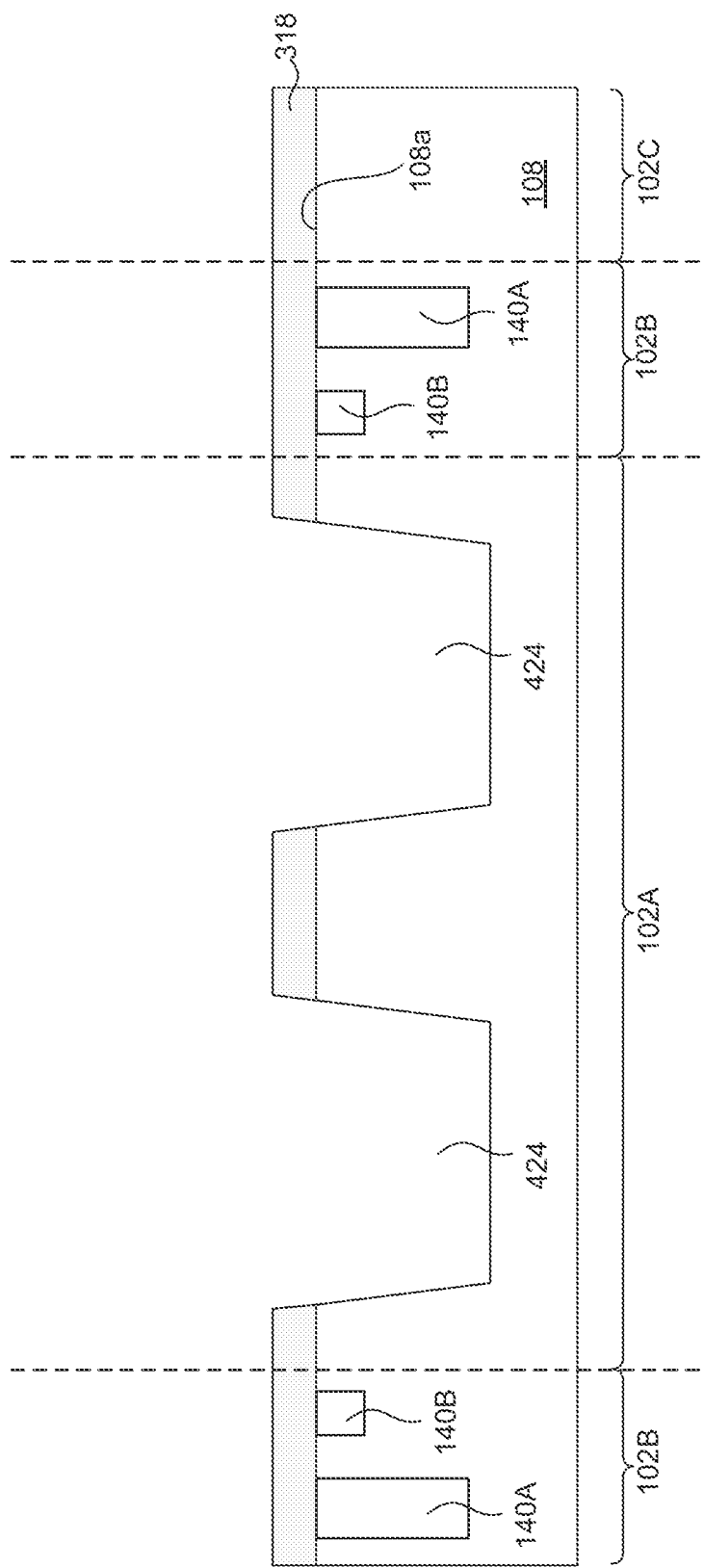
Figure 5:
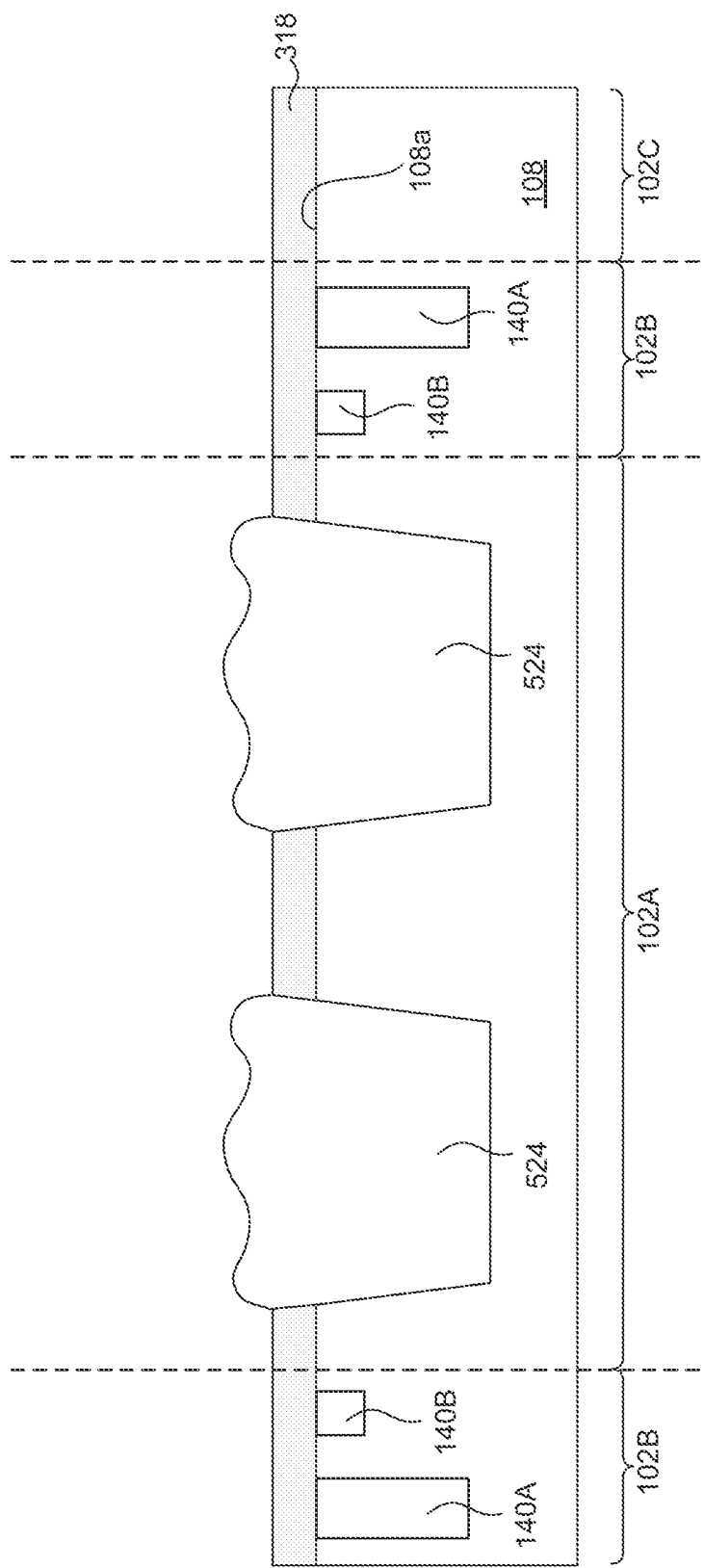
Figure 6:
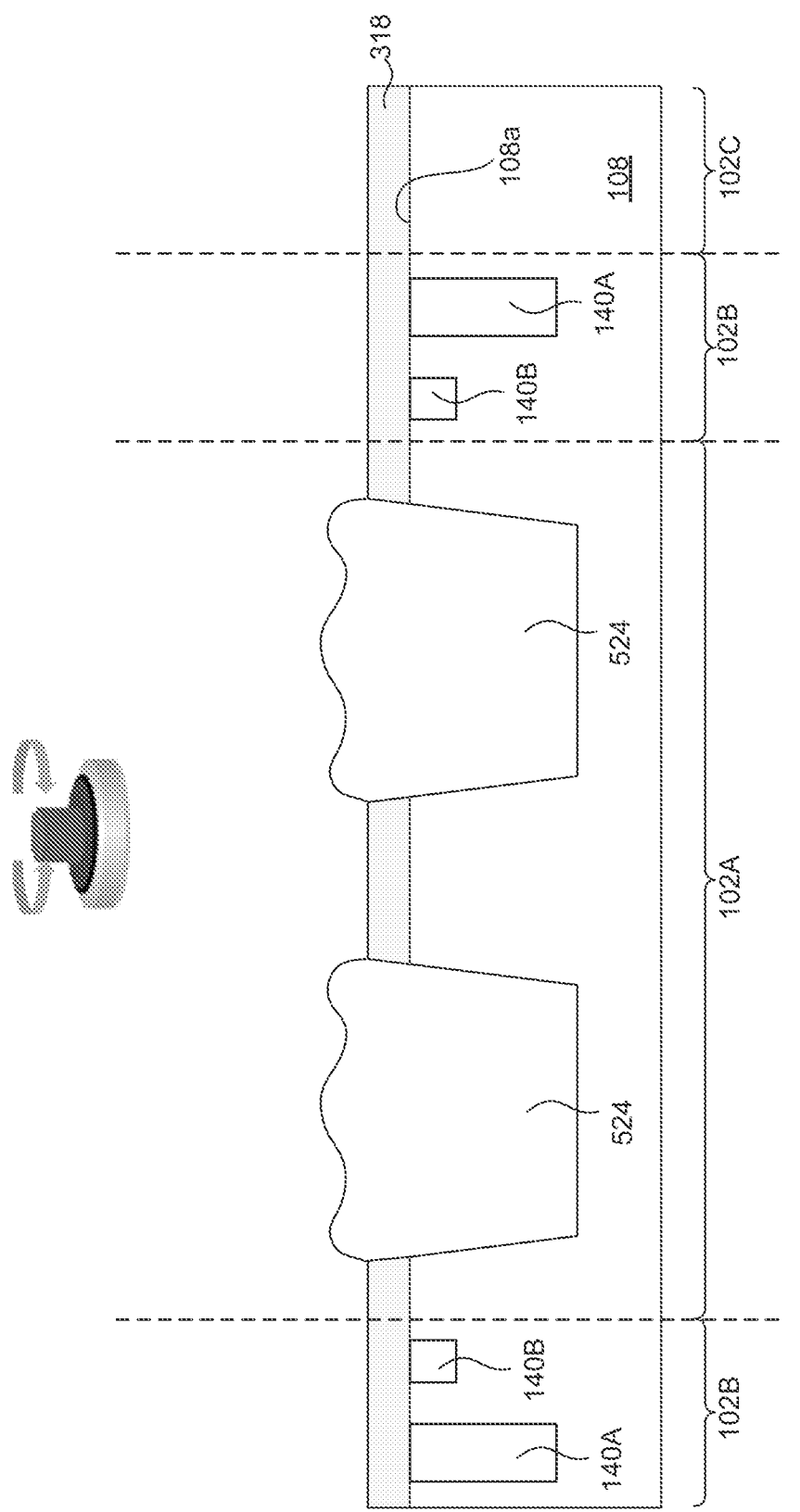

Referring to FIG. 2, in operation 210, epitaxial structures are formed on the front side surface of the substrate. For example, as described with reference to FIGS. 4-9, epitaxial structures 124 can be formed at the same time on front side surface 108a of substrate 108. The formation of epitaxial structures 124 can include sequential operations of (i) forming trenches 424 at the same time in substrate 108 through dielectric layer 318, as shown in FIG. 4, (ii) epitaxially growing, at the same time, structures 524 within trenches 424 of FIG. 4, as shown in FIG. 5, (iii) performing a CMP process on the structure of FIG. 5, as shown in FIG. 6, to form epitaxial structures 724 within trenches 424 of FIG. 4, as shown in FIG. 7, (iv) etching epitaxial structures 724 of FIG. 7 to form epitaxial structures 124 with heights H1-H2, as shown in FIG. 8, and (v) performing a cleaning process on the structure of FIG. 8, which can result in the structure shown in FIG. 9.

The formation of trenches 424 can include a dry etching process with etchants, such as chlorine-based gas, helium, fluorine-based gas, argon, and a combination thereof. The epitaxial growth of structures 524 can include epitaxially growing monocrystalline or polycrystalline structures of a semiconductor material, such as a group IV element (e.g., Si, Ge, etc.) of the periodic table. The CMP process can include using a CMP slurry with a higher removal selectivity for the material of structures 524 than for the material of dielectric layer 318. The term "removal selectivity" refers to the ratio of the removal rates of two different materials under the same removal conditions. In some embodiments, the CMP slurry can have a removal selectivity that is about 20 times to about 200 times greater for the material of structures 524 than for the material of dielectric layer 318. The CMP slurry can include hydrogen peroxide, potassium peroxydisulfate, nitrogen-oxide-based compound, polyethylene glycol, abrasive particles, such as colloidal silica, fumed silica, aluminum oxide, and a combination thereof.

Figure 7:
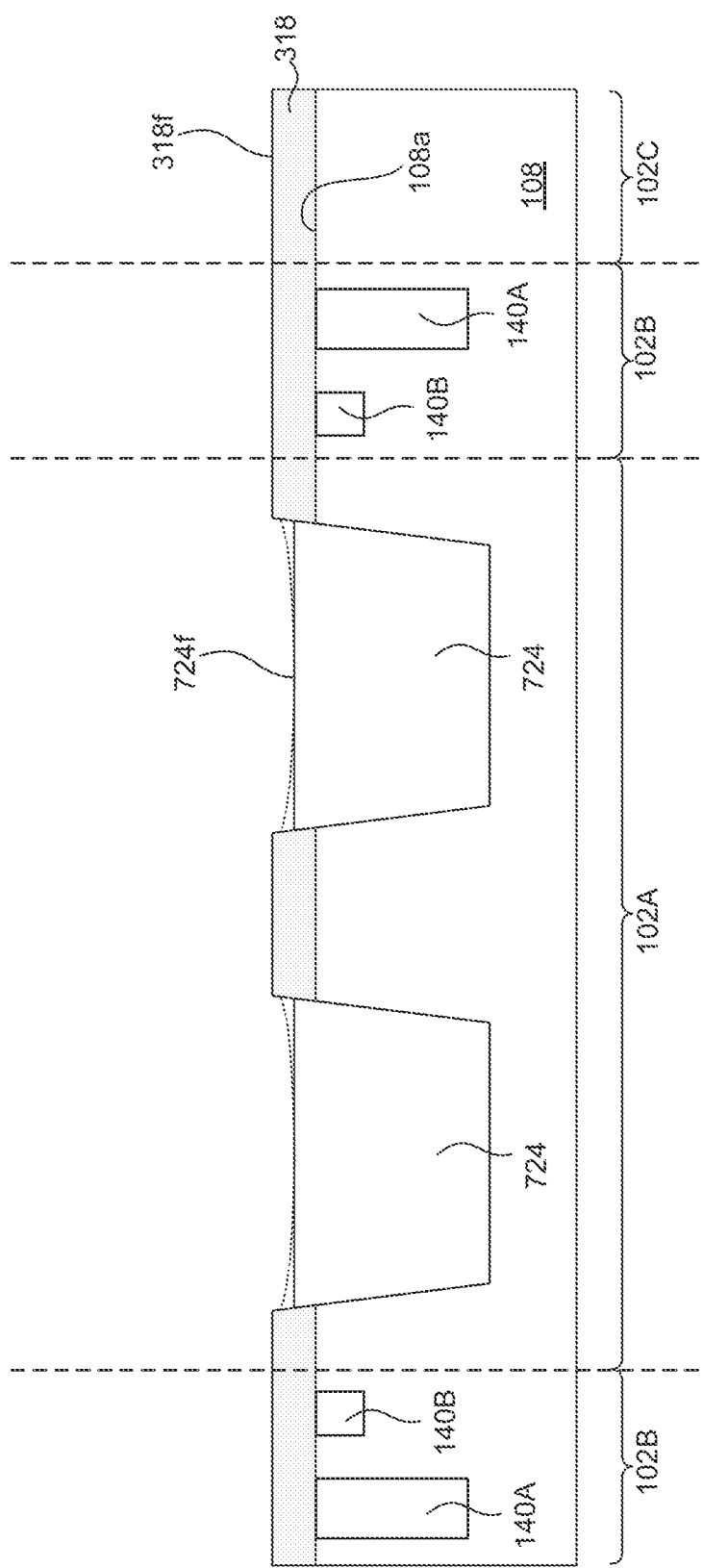
Figure 8:
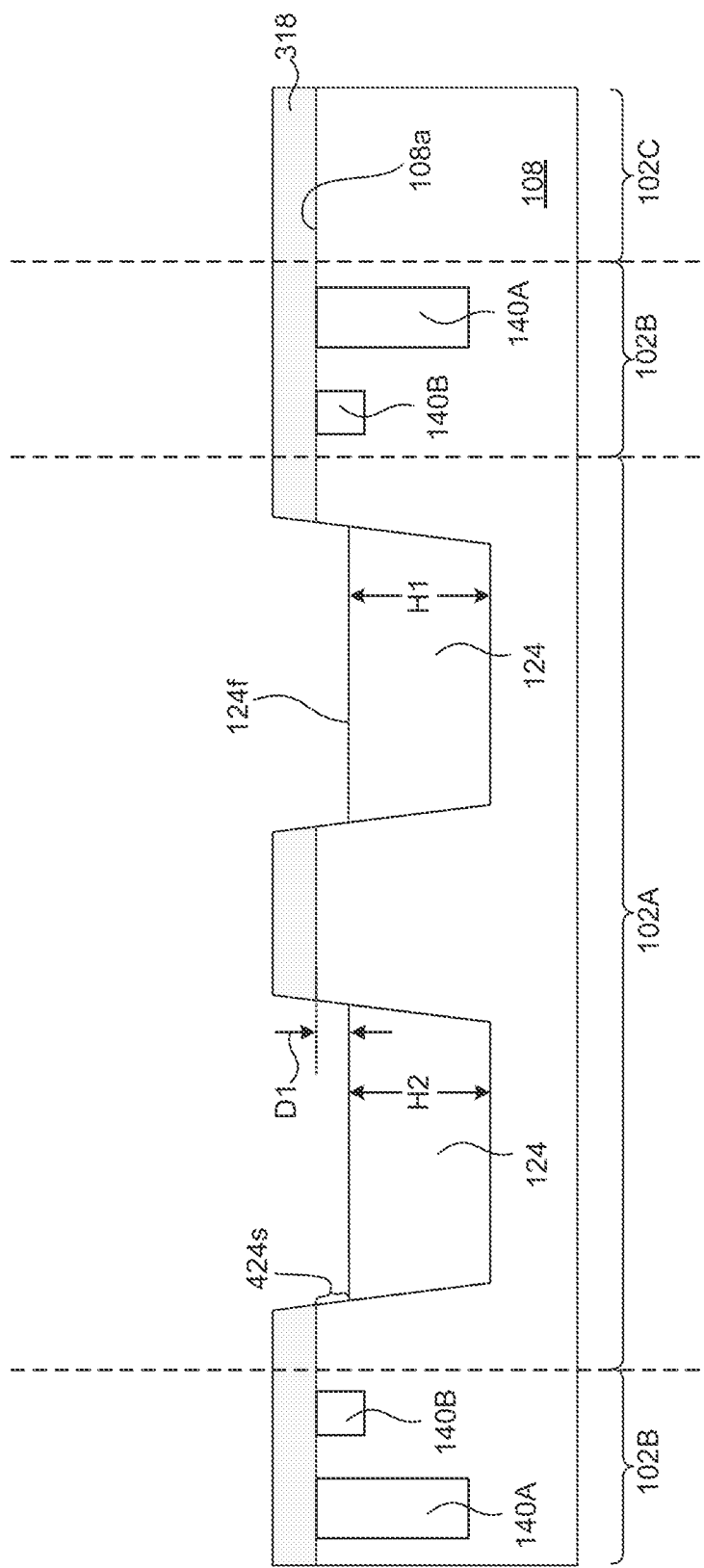

In some embodiments, the CMP process can form a substantially flat surface profile (solid line) of front side surface 724f of epitaxial structure 724 or a curved surface profile (dotted line) of front side surface 724f, as shown in FIG. 7. In some embodiments, front side surface 724f can be substantially coplanar (not shown) or non-coplanar (shown in FIG. 7) with front side surface of dielectric layer 318.

The etching of epitaxial structures 724 can include a wet etch process, a dry etch process, or a vapor etch process using halogen-based etchants. The etchants have a higher etch selectivity (e.g., about 20 to about 50 times higher) for the material of epitaxial structures 724 than the etch selectivity for the material of dielectric layer 318 and substrate 108. The etching of epitaxial structures 724 to form epitaxial structures 124 can expose a sidewall portion 424s of trench 424 (FIG. 4) by lowering front side surface 124f by a distance D1 along a Z-axis from front side surface 108a of substrate 108. Distance D1 can range from about 50 nm to about 100 nm or can be any other suitable dimensions. Heights H1-H2 of epitaxial structures 124 can be equal to or different from each other.

Figure 9:
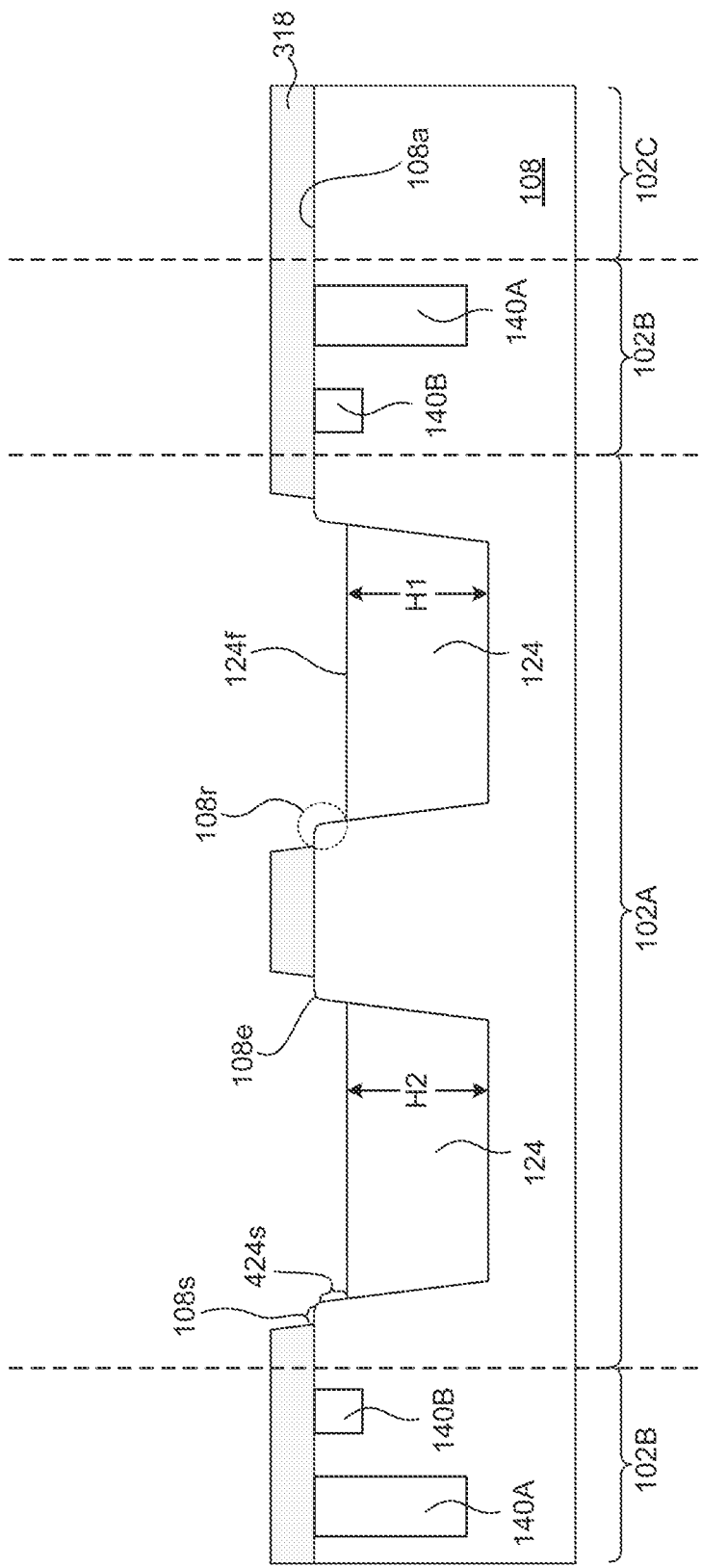

The cleaning process can include cleaning the structure of FIG. 8 to remove contaminants and/or residues from the CMP process and/or the etching process with an acid-based cleaning solution, such as diluted hydrofluoric acid (DHF), for a time period of about 20 seconds to about 60 seconds. In some embodiments, the DHF solution can have a water to HF ratio of about 50:1 to about 100:1. In some embodiments, the cleaning solution can etch portions of dielectric layer 318 to expose a surface portion 108s of front side surface 108s and can etch exposed portions of substrate 108 to round substrate edges (also referred to as trench edges 108e), as shown in FIG. 9. Thus, the etching and cleaning processes form exposed substrate regions 108r that includes the exposed sidewall portions 424s, surface portions 108s, and rounded substrate edges 108e, as shown in FIG. 9.

Figure 10:
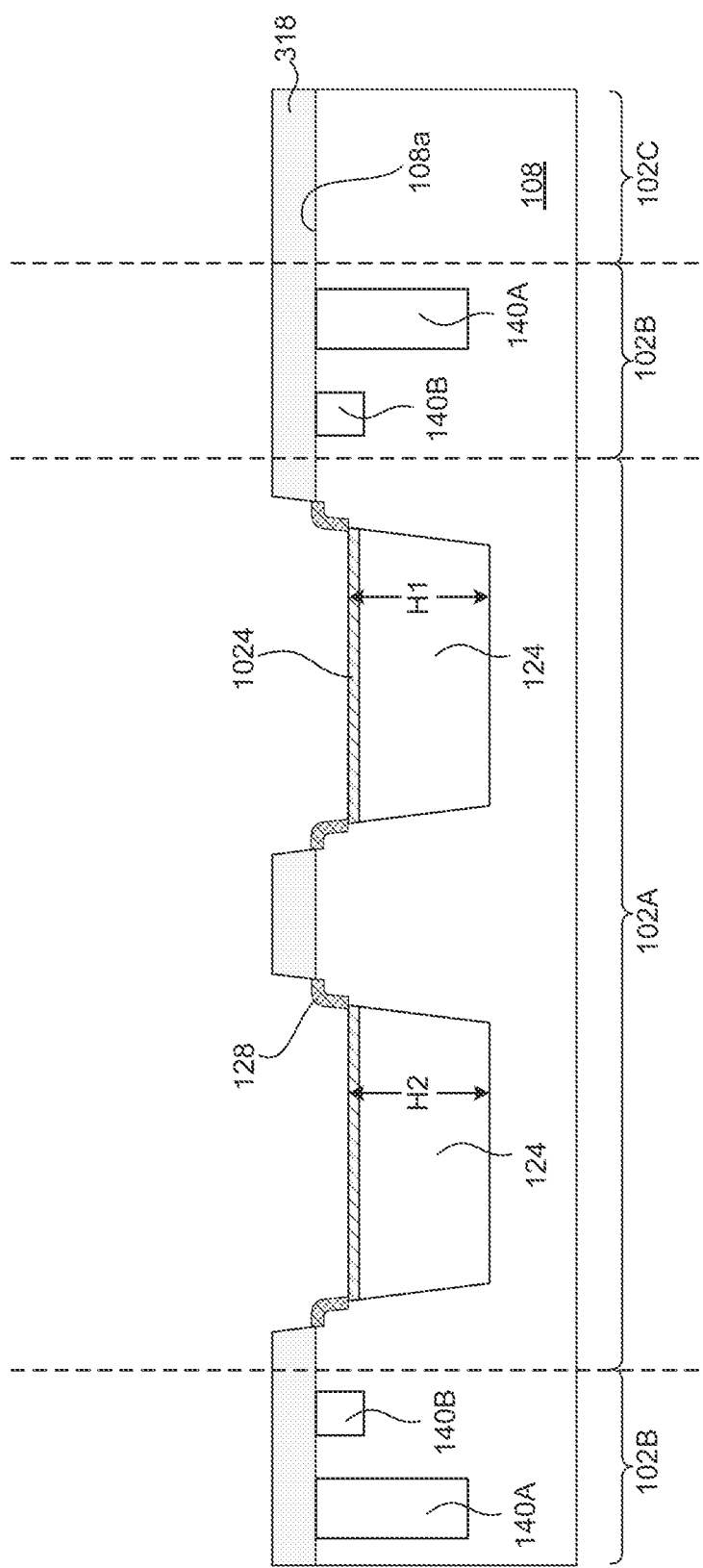

Referring to FIG. 2, in operation 215, barrier layers are formed at substrate edges that are adjacent to the epitaxial structures. For example, as shown in FIG. 10, barrier layers 128 are formed on exposed substrate regions 108r of FIG. 10. Forming barrier layers 128 on exposed substrate regions 108r can prevent the materials of epitaxial structures 124 from laterally expanding and reacting with the material of substrate regions 108r during subsequent high temperature processes. The lateral expansion of epitaxial structures 124 can deform the surface profile of epitaxial structures 124.

The formation of barrier layers 128 can include performing an oxidation process on the structure of FIG. 9. The oxidation process can include oxidizing exposed substrate regions 108r of FIG. 9 with an oxidizing solution for a time period of about 60 seconds to about 120 seconds. The oxidizing solution can include deionized water and ozone or hydrogen peroxide ($H_2O_2$). In some embodiments, the oxidizing solution of deionized water and ozone can include about 10 parts per million (ppm) to about 100 ppm of ozone. In some embodiments, the oxidizing solution of $H_2O_2$ can include a water to $H_2O_2$ ratio of about 50:1 to about 100:1. In some embodiments, the oxidizing solution can oxidize a top portion of epitaxial structures 124 to form oxide layers 1024 on epitaxial structures 124, as shown in FIG. 10. Thus, oxide layers 1024 include an oxide of the material of epitaxial structures 124.

Figure 11:
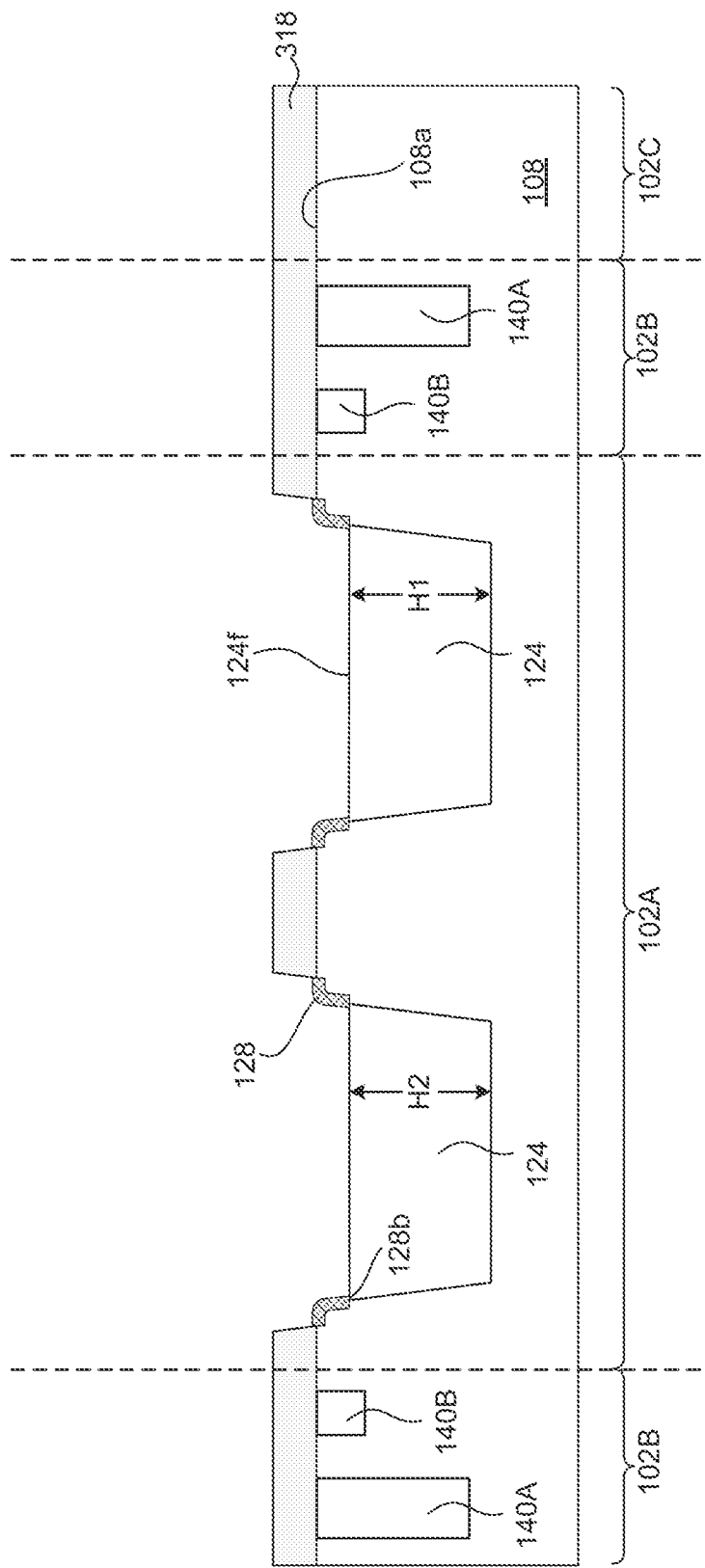

Following the formation of barrier layers 128, an annealing process can be performed on the structure of FIG. 10 at a temperature of about 500° C. to about 800° C. in a hydrogen ambient. The annealing process can reduce oxide layers 1024 to the material of epitaxial structures 124, as shown in FIG. 11. For example, when epitaxial structures 124 include Ge and oxide layer 1024 includes germanium oxide ($GeO_x$), the annealing process can reduce $GeO_x$ to Ge.

Figure 12:
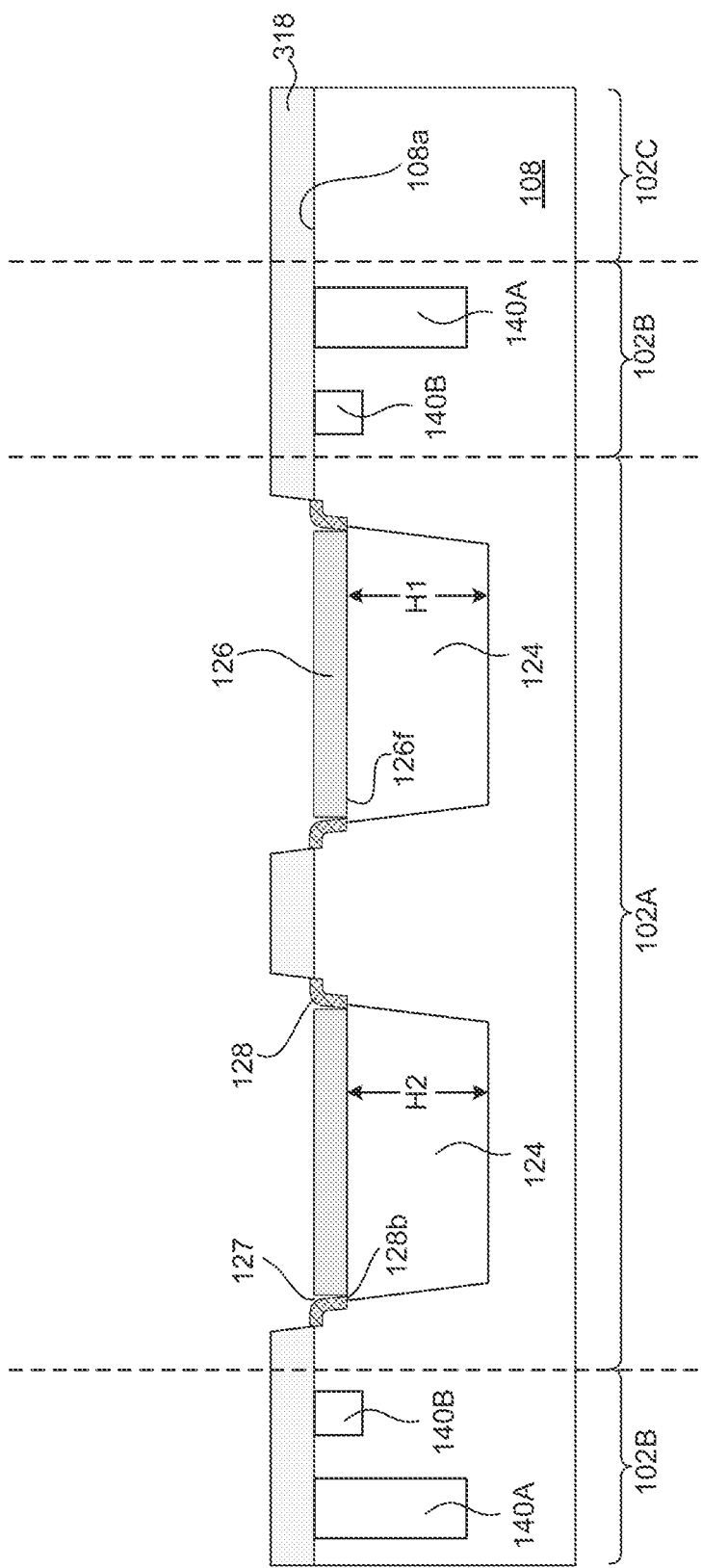

Referring to FIG. 2, in operation 220, capping layers are formed on the epitaxial structures. For example, as shown in FIG. 12, capping layers 126 can be formed on epitaxial structures 124. In some embodiments, the formation of capping layers 126 can include epitaxially growing a Si, Ge, or SiGe layer on epitaxial structures 124. The profiles and dimensions of capping layers 126 of FIG. 12 can be similar to that described above with reference to FIGS. 1B-1C.

Figure 13:
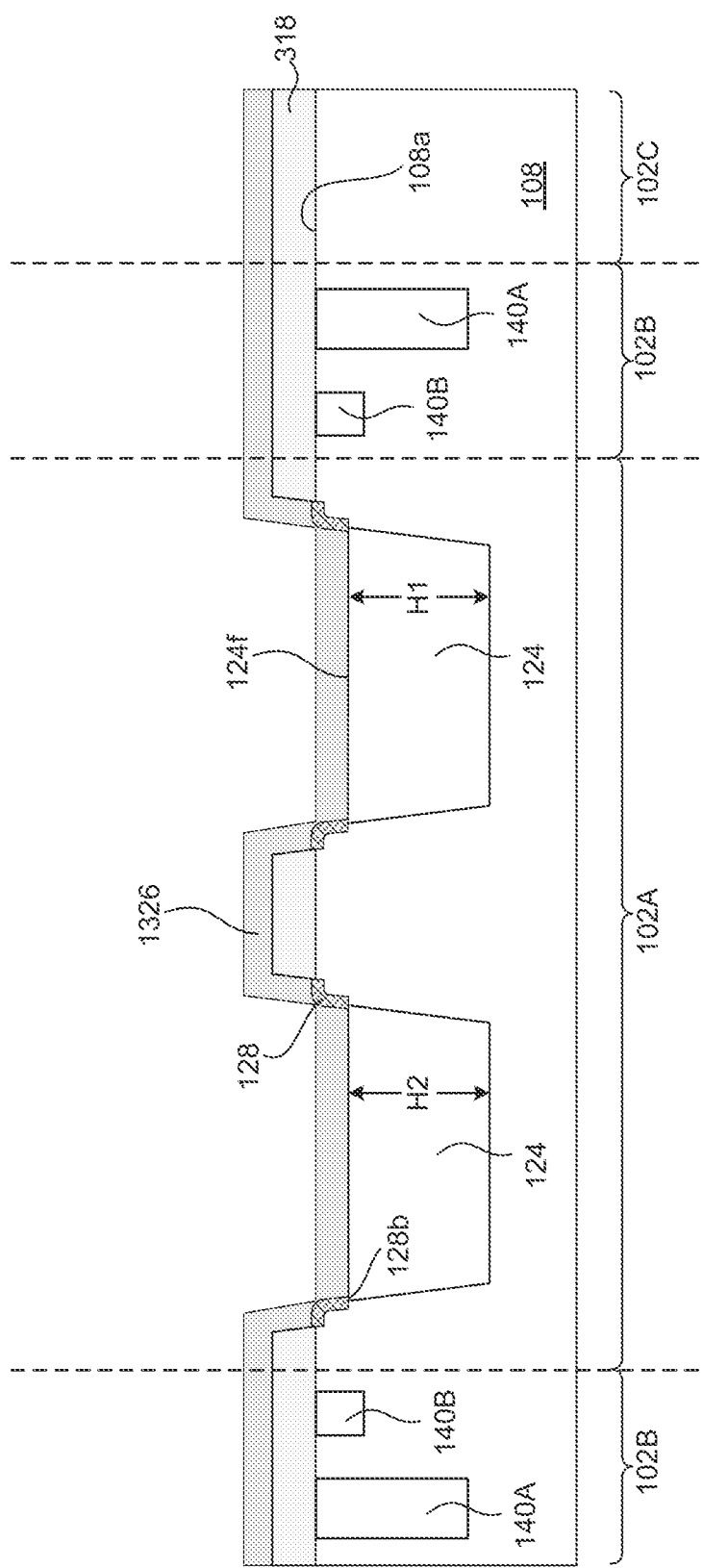
Figure 14:
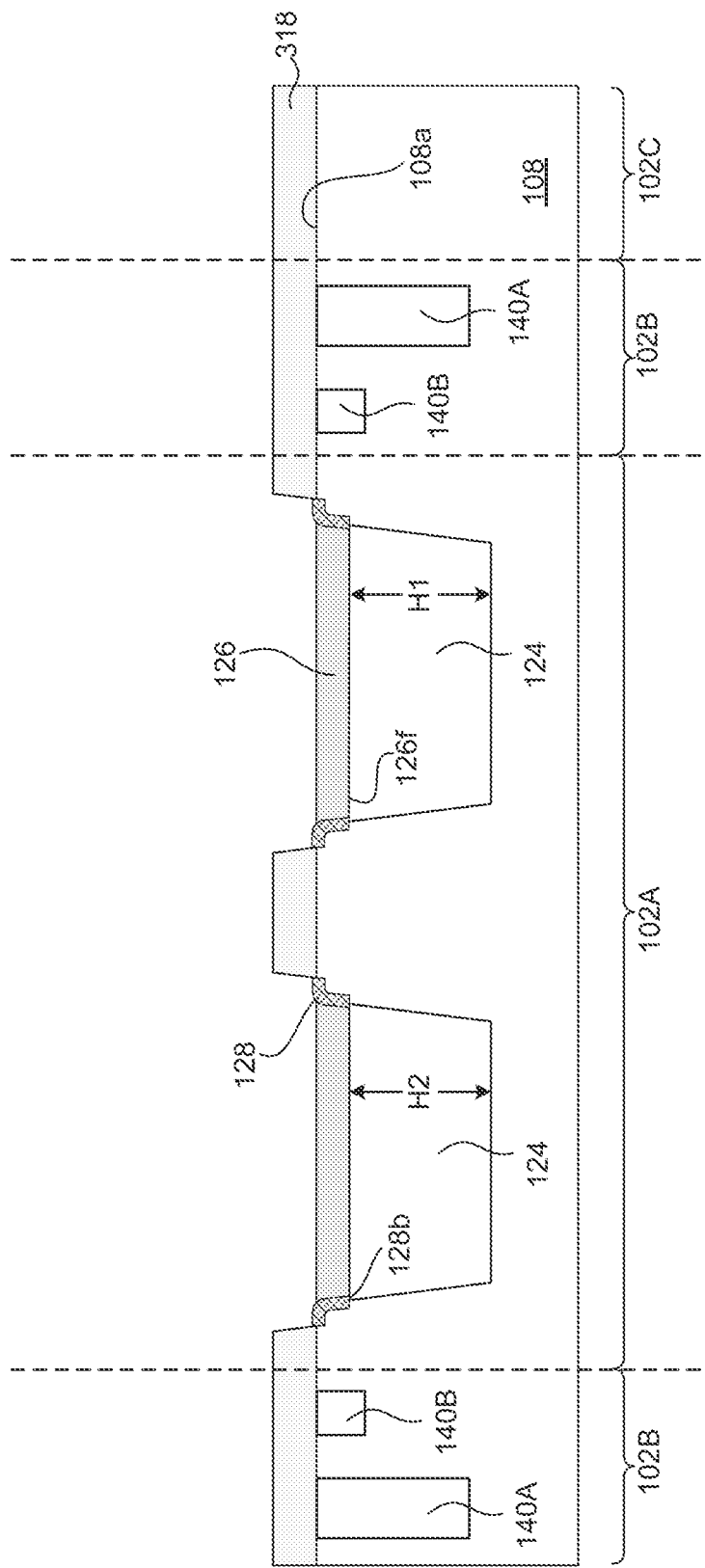

In some embodiments, instead of epitaxially growing capping layers 126, the formation of capping layers 126 can include sequential operations of (i) depositing a Si, Ge, or SiGe layer 1326 on the structure of FIG. 11 to form the structure of FIG. 13, (ii) forming a patterned masking layer (not shown) on layer 1326 to protect portions of layer 1326 on epitaxial structures 124, and (iii) selectively etching portions of layer 1326 that are not protected by the patterned masking layer to form the structure of FIG. 14. The deposition of Si, Ge, or SiGe layer can include using a silicon precursor (e.g., silane ($SiH_4$) or dichlorosilane (DCS)) and/or a germanium precursor (e.g., germane ($GeH_4$)) in a chemical vapor deposition (CVD) process or an atomic layer deposition (ALD) process. The profiles and dimensions of capping layers 126 of FIG. 14 can be similar to that described above with reference to FIGS. 1D and 1F.

Figure 15:
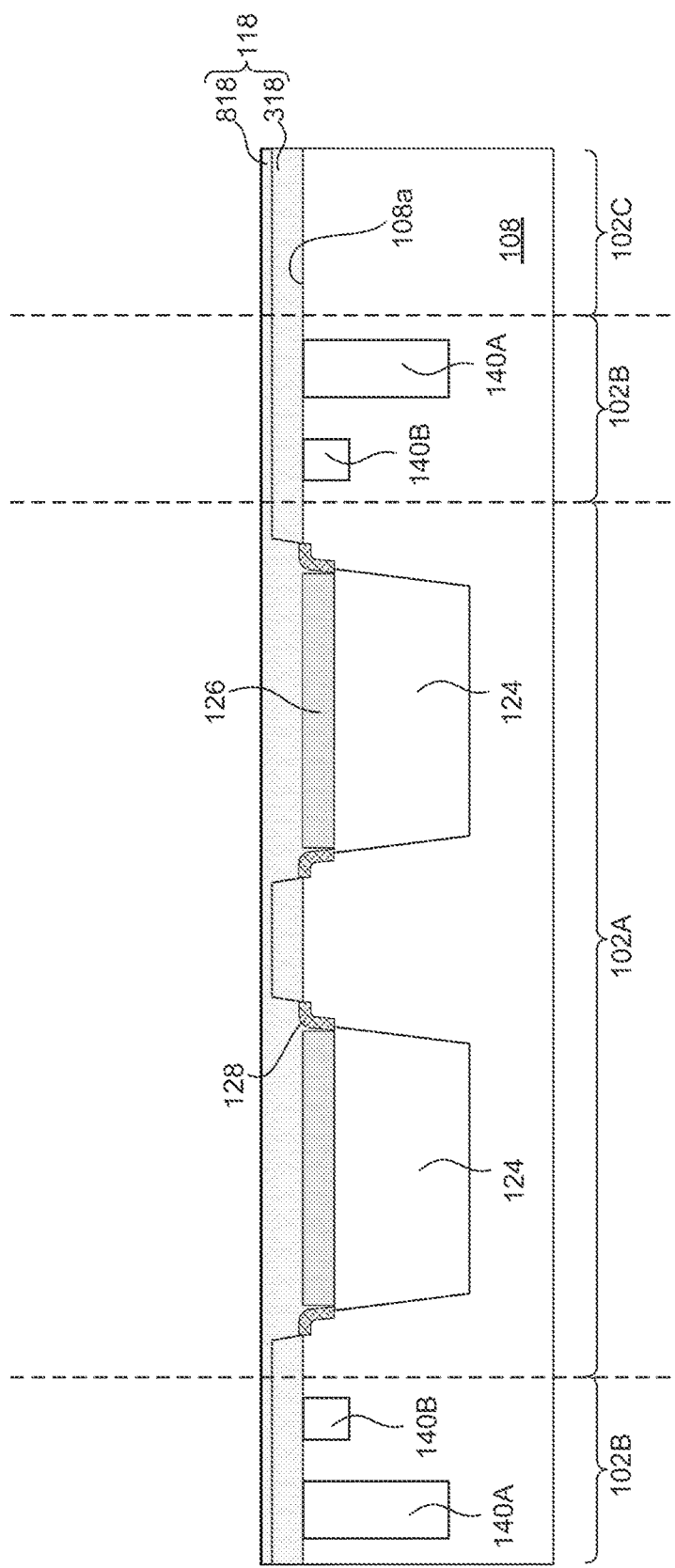

In some embodiments, following the formation of capping layers 126, a dielectric layer 818 with material similar to the material of dielectric layer 318 can be deposited on the structure of FIG. 12 to form the structure of FIG. 15. The formation of dielectric layer 818 can include using a CVD process, an ALD process, or a thermal oxidation process.

Figure 16:
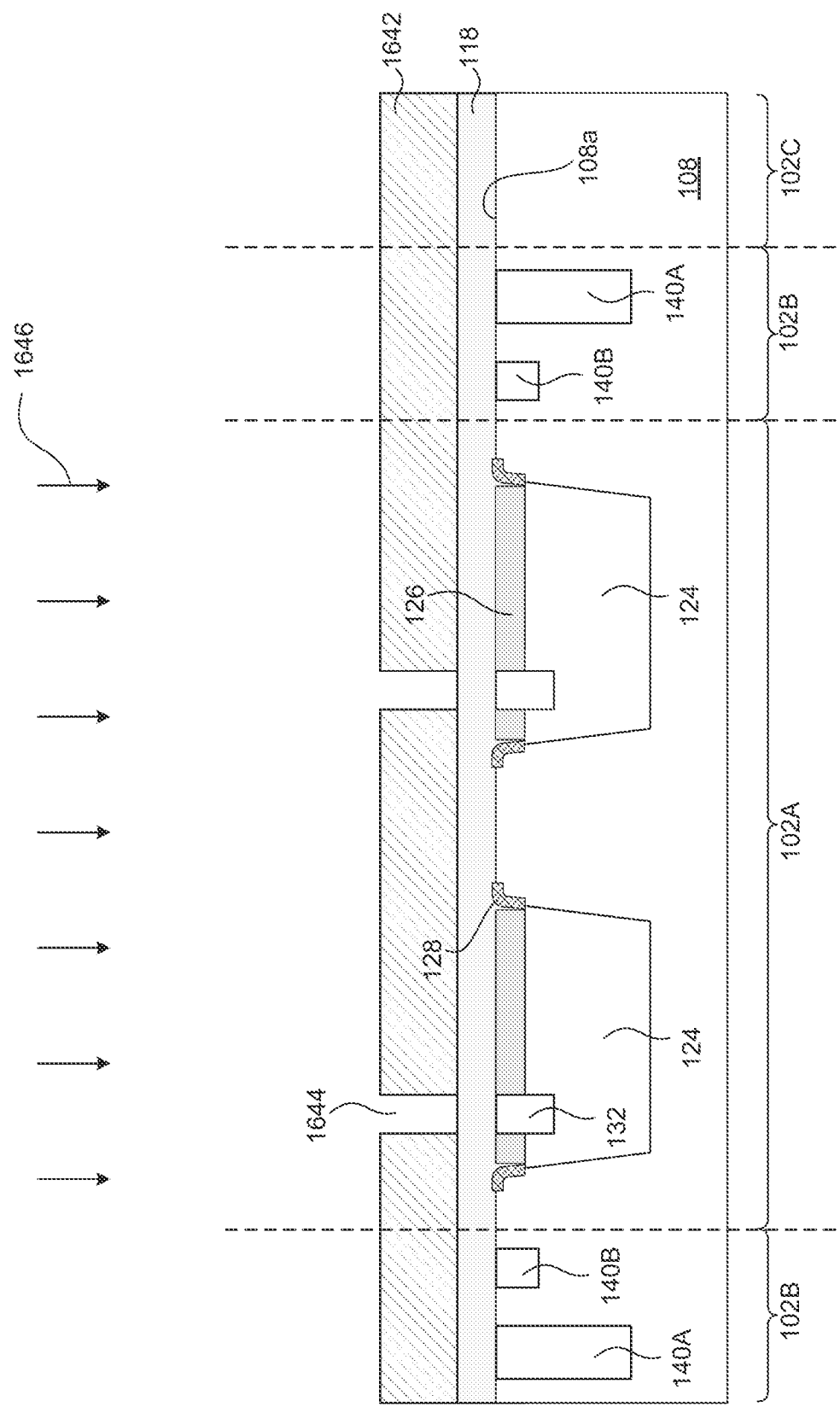
Figure 17:
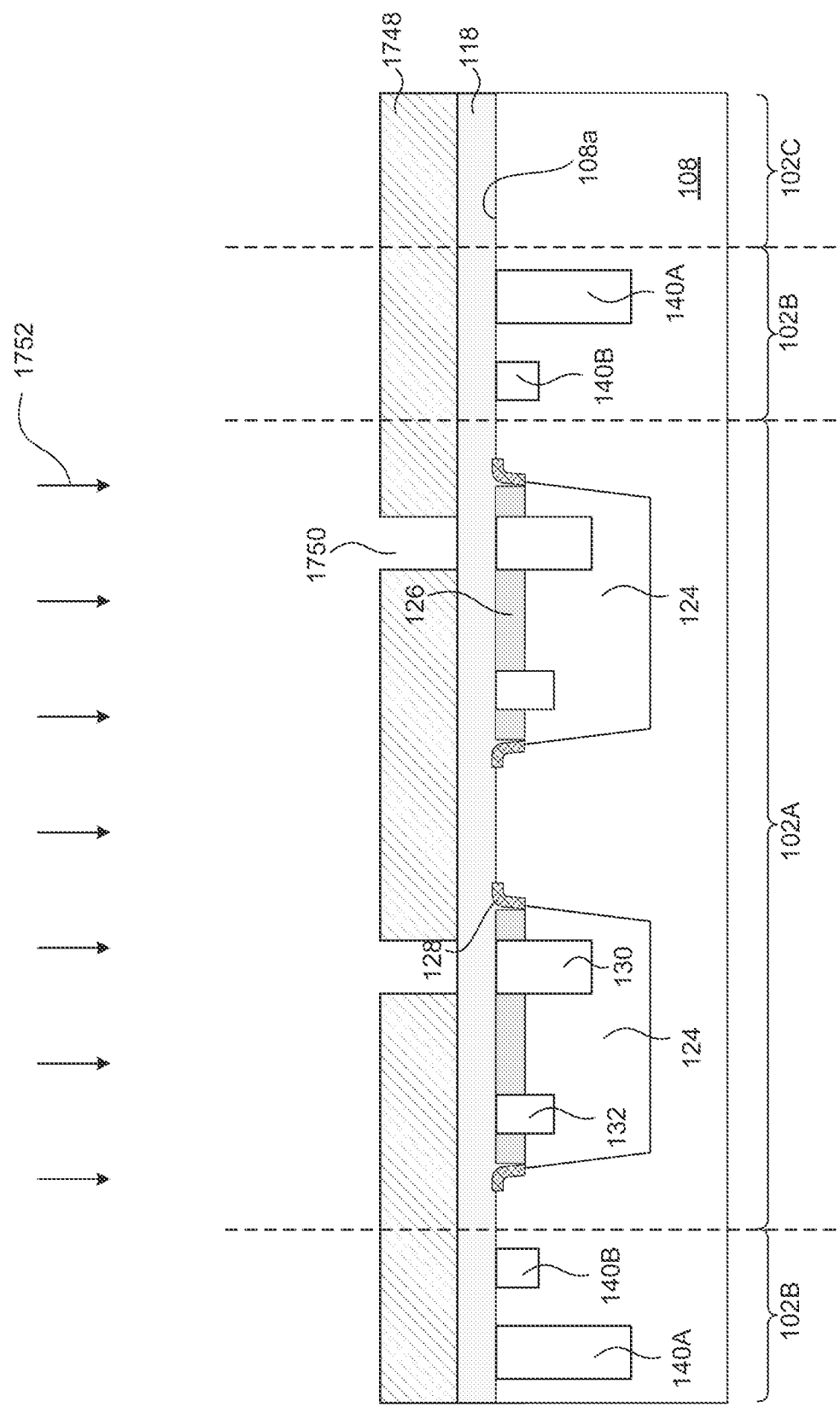
Figure 18:
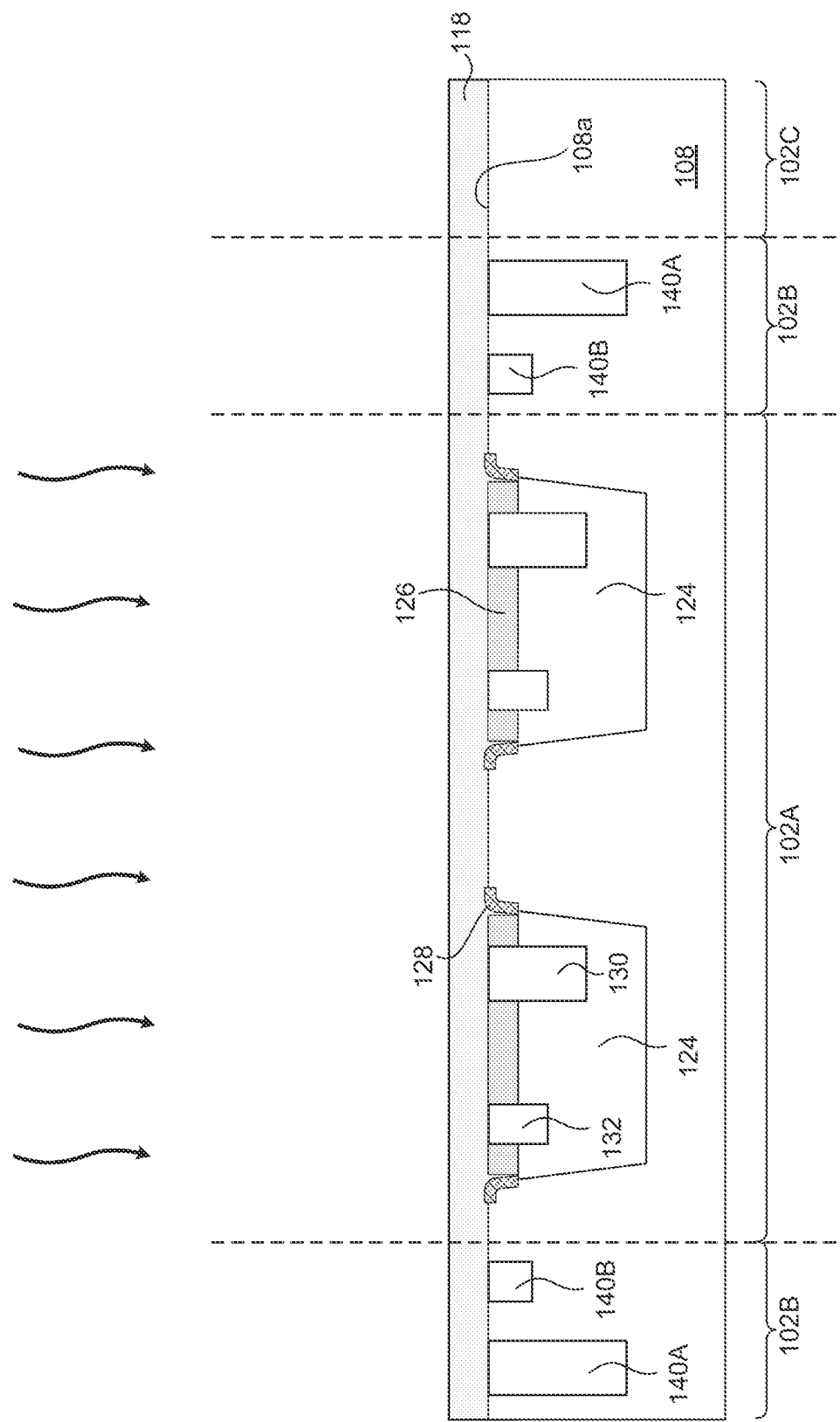

Referring to FIG. 2, in operation 225, doped regions are formed within the epitaxial structures and the capping layers. For example, as described with reference to FIGS. 16-18, p-type doped regions 130 and n-type doped regions 132 can be formed within capping layers 126 and epitaxial structures 124. The formation of p-type doped regions 130 and n-type doped regions 132 can include sequential operations of (i) forming a patterned masking layer 1642 with openings 1644 on the structure of FIG. 15, as shown in FIG. 16, (ii) ion implanting n-type dopants 1646 into capping layers 126 and epitaxial structures 124 through openings 1644 to form doped regions 132, as shown in FIG. 16, (iii) removing patterned layer 1642 (not shown), (iv) forming a patterned masking layer 1748 with openings 1750, as shown in FIG. 17, (v) ion implanting p-type dopants 1752 into capping layers 126 and epitaxial structures 124 through openings 1750 to form p-type doped regions 130, as shown in FIG. 17, and (vii) performing an annealing process on the structure of FIG. 18 after removing patterned layer 1748 to activate the dopants in doped regions 130-132.

Figure 22:
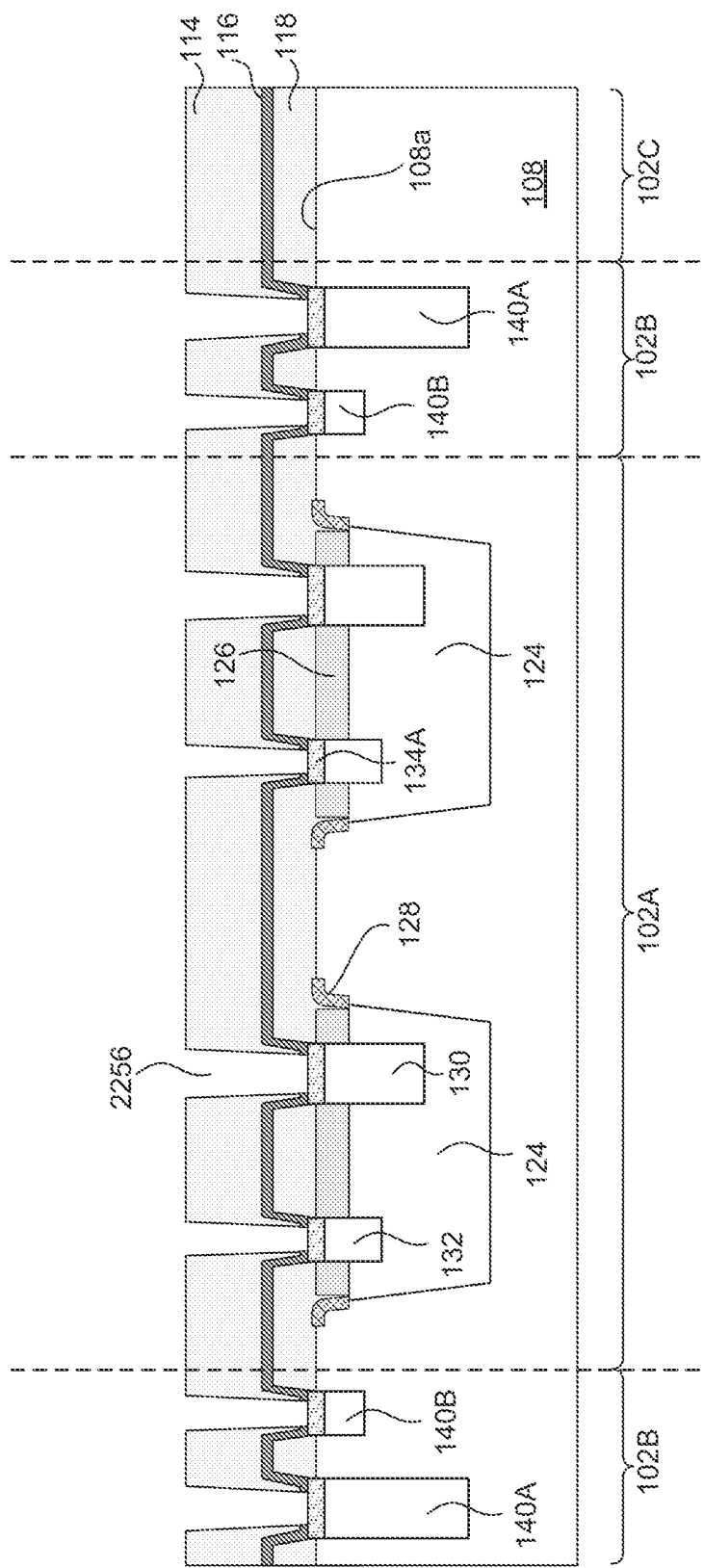
Figure 23:
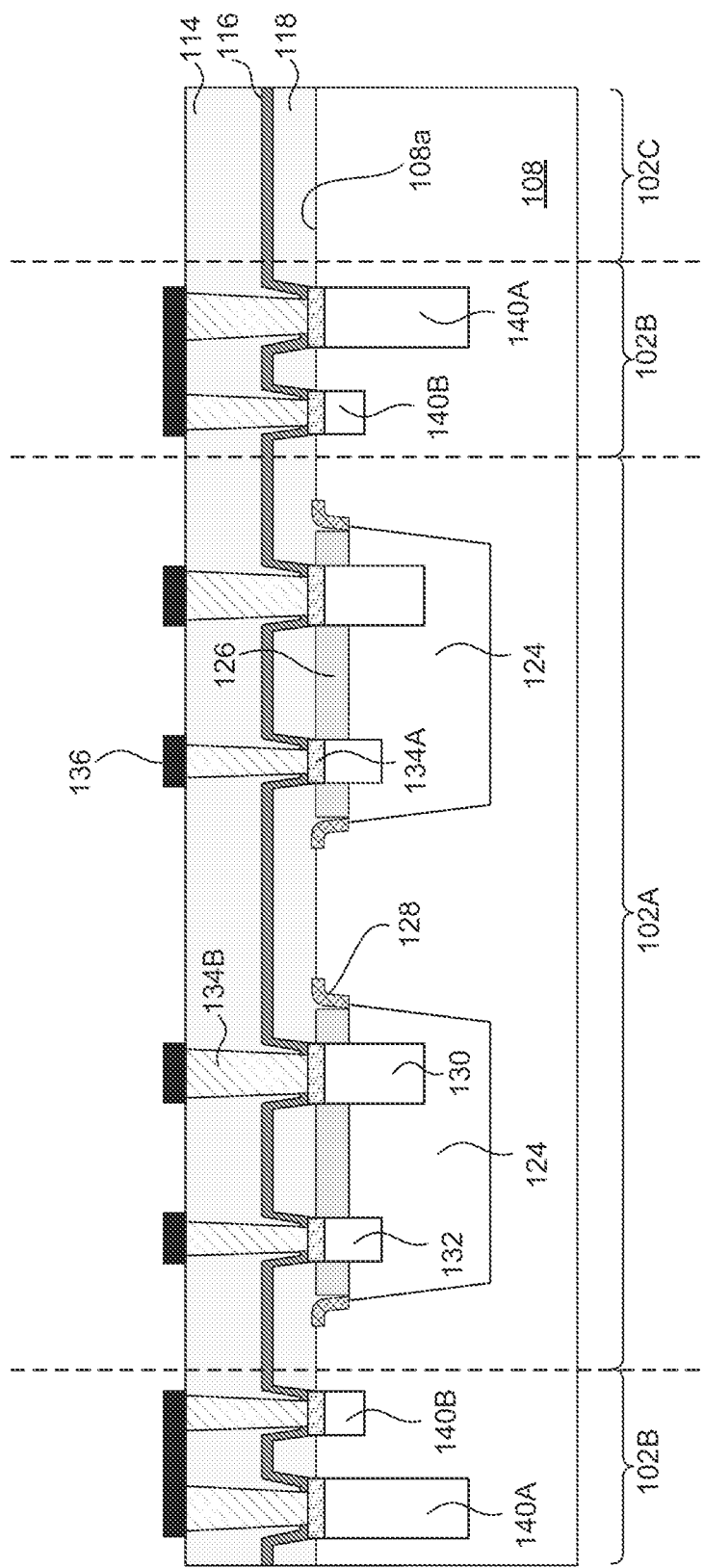

Referring to FIG. 2, in operation 230, contact structures and via structures are formed on the doped regions and the isolation structures. For example, as described with reference to FIGS. 19-23, contact structures 134 with silicide layers 134A and contact plugs 134B are formed on doped regions 130-132 and 140A-140B, and via structures 136 are formed on contact structures 134. The formation of contact structures 134 can include sequential operations of (i) forming silicide openings 1954 on doped regions 130-132 and 140A-140B, as shown in FIG. 19, (ii) forming silicide layers 134A on doped regions 130-132 and 140A-140B, as shown FIG. 20, (iii) depositing ESL 116 on the structure of FIG. 20 to form the structure of FIG. 21, (iv) depositing ILD layer 114 on the structure of FIG. 21, as shown in FIG. 22, (v) forming contact openings 2256 within ILD layer 114 and ESL 116 to expose portions of silicide layers 134A, as shown in FIG. 22, and (vi), forming contact plugs 134B within contact openings 2256, as shown in FIG. 23.

Figure 19:
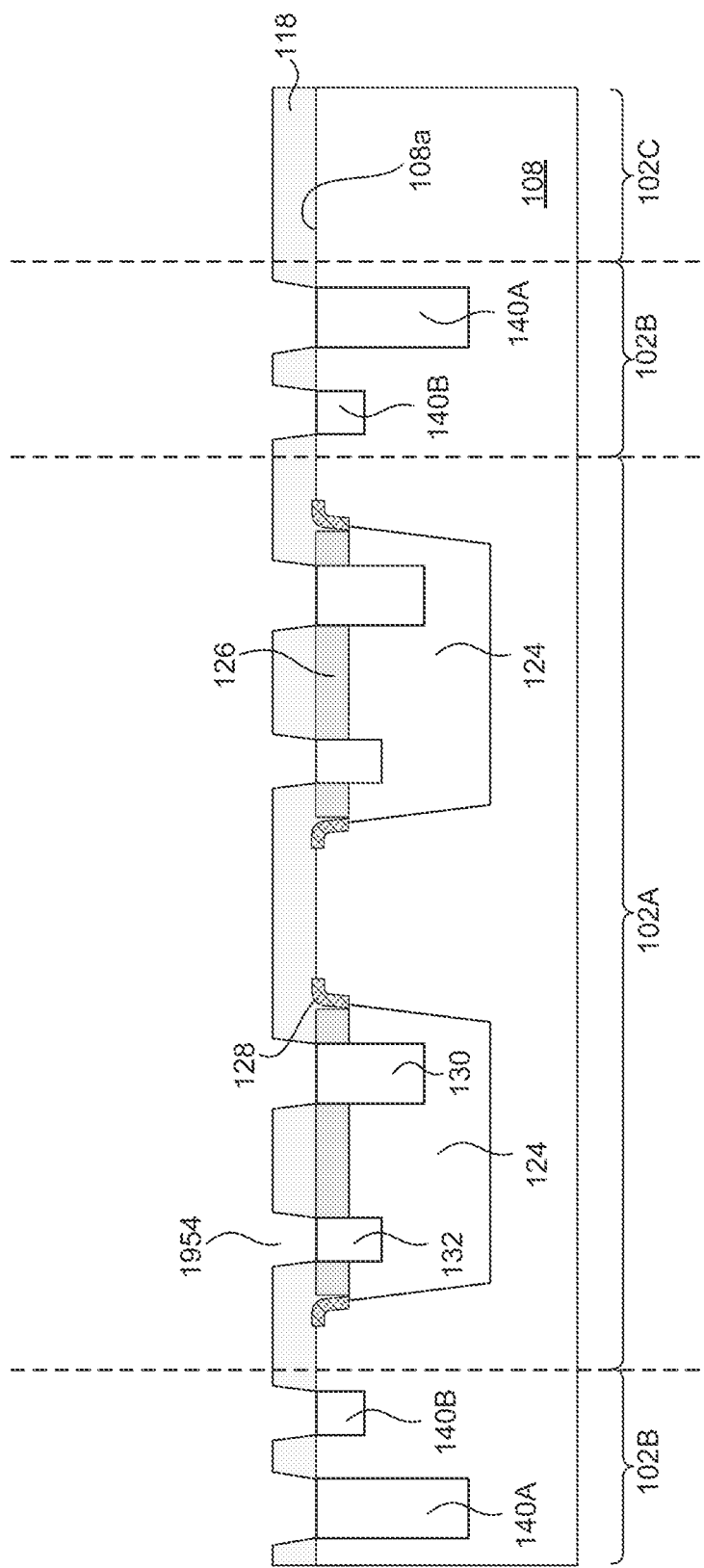
Figure 20:
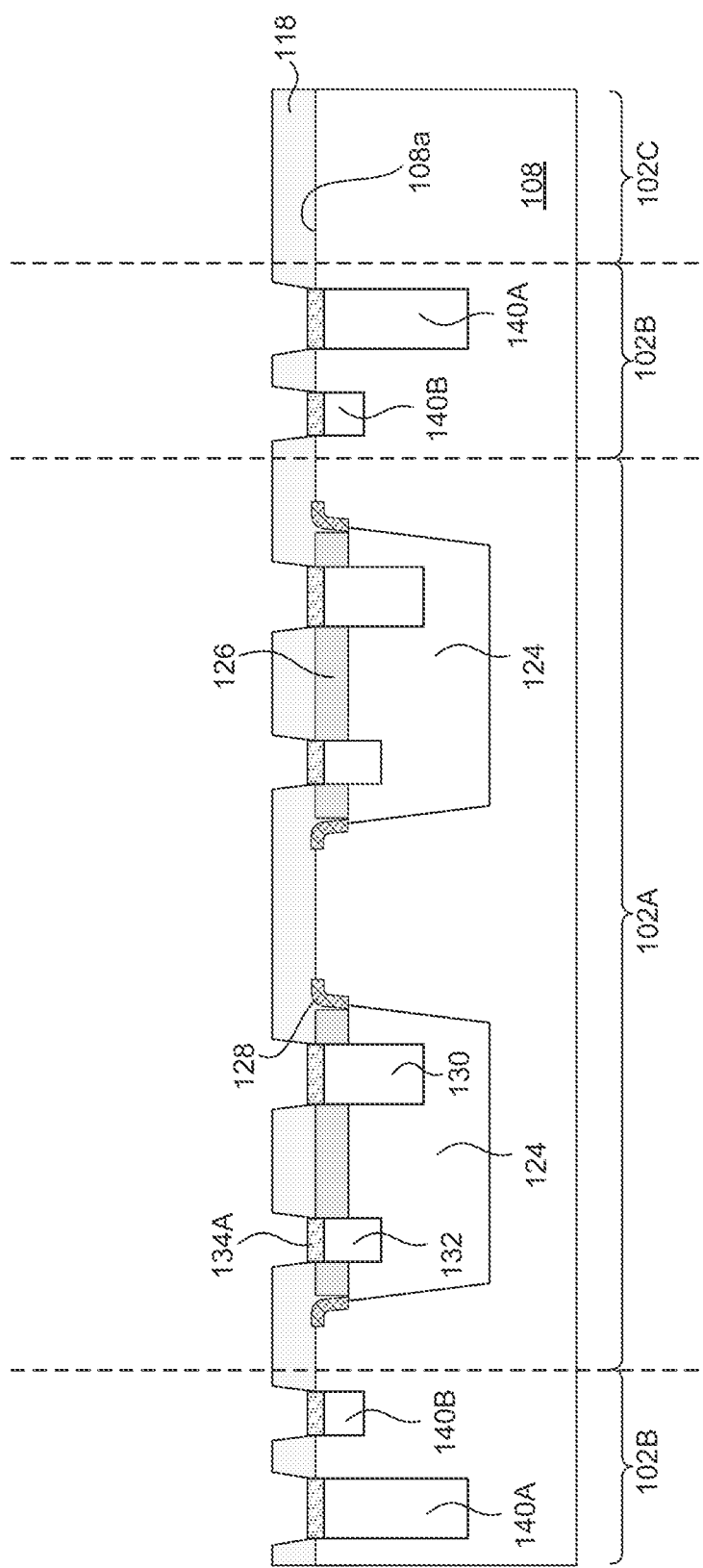
Figure 21:
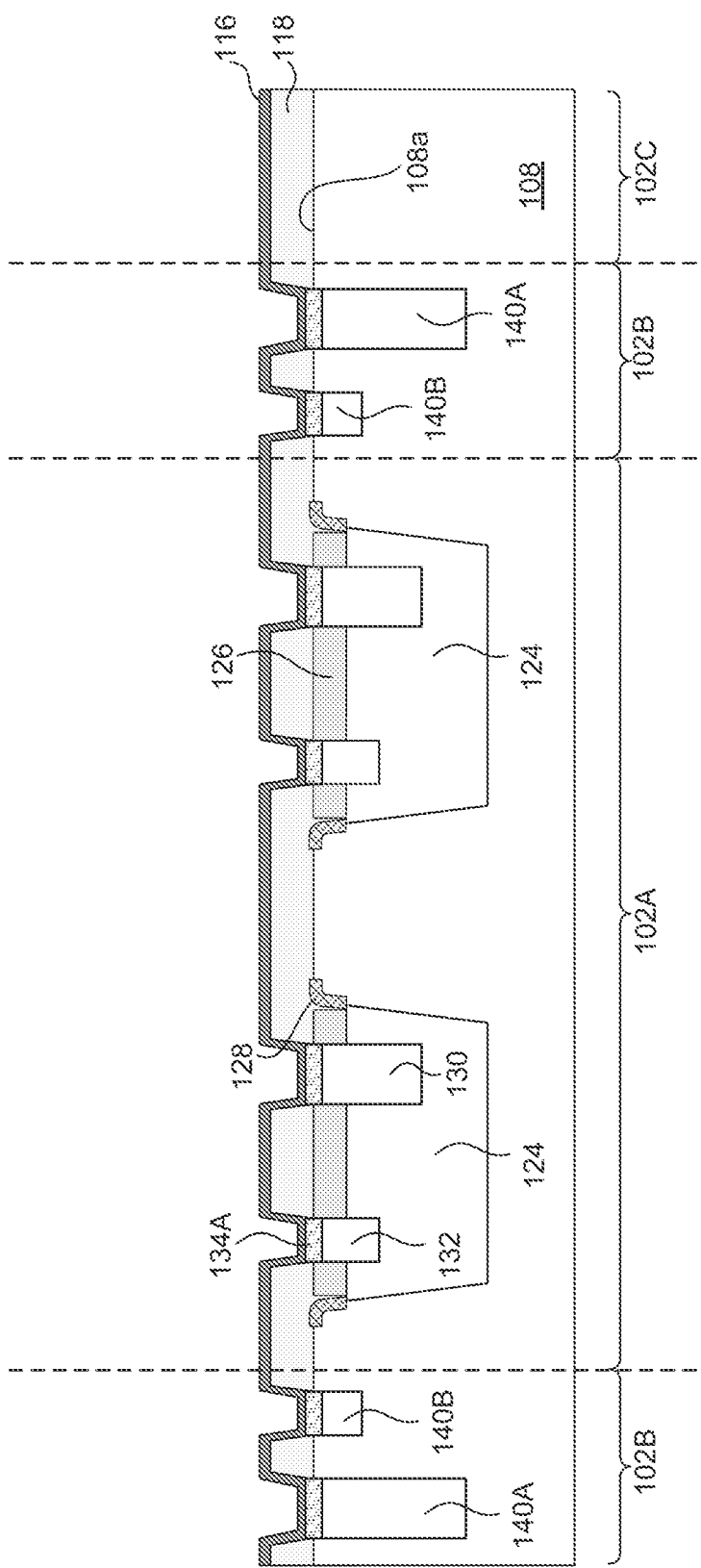
Figure 24:
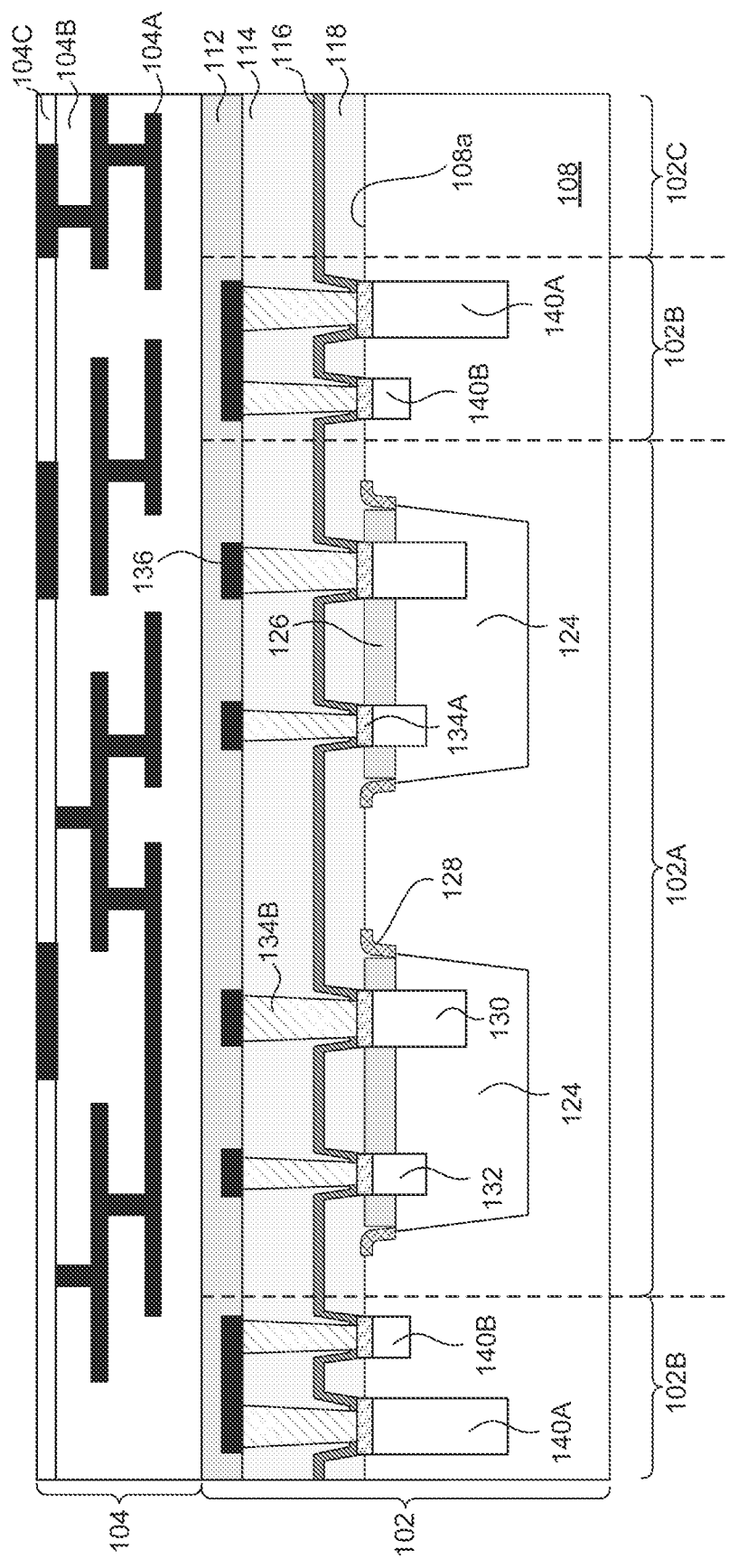

The formation of silicide layers 134A can include sequential operations of (i) depositing a metal layer (not shown) on the structure of FIG. 19, (ii) performing an annealing process on the structure with the metal layer, and (iii) removing the non-reacted portions of the metal layer on dielectric layer 118 to form the structure of FIG. 20. The formation of via structures 136 can include depositing a metal layer (not shown) on the structure after the formation of contact plugs 134B and patterning the deposited metal layer to form the structure of FIG. 23. Following the formation of via structures 136, passivation layer 112 can be deposited on the structure of FIG. 23, as shown in FIG. 24.

Figure 25:
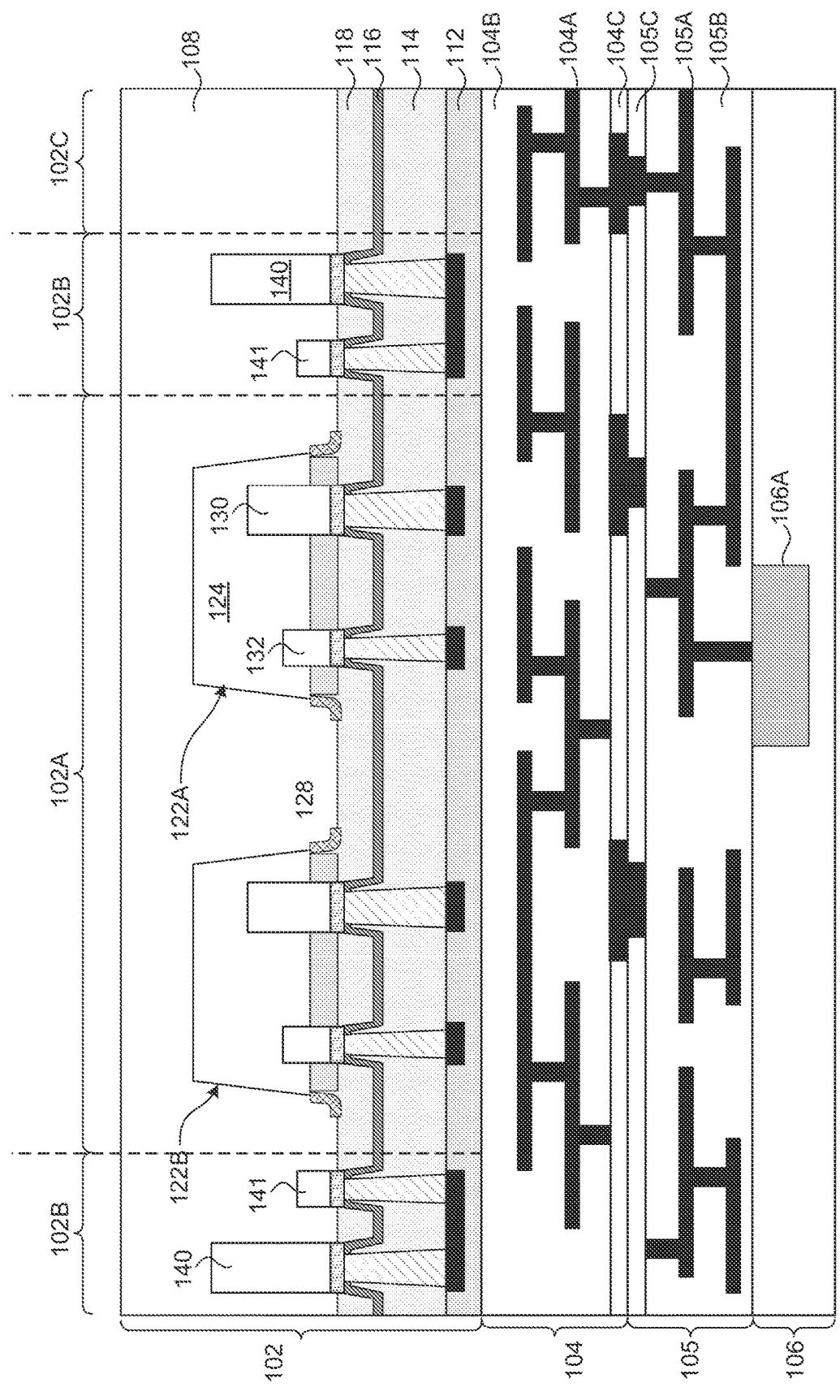

Referring to FIG. 2, in operation 235, a multi-level metallization layer is formed on the via structures and bonded to an integrated circuit. For example, as shown in FIG. 25, first multi-level metallization layer 104 with multi-level interconnect structure 104A embedded within IMD layer 104B is formed on via structures 136 and passivation layer 112. The formation of multi-level metallization layer 104 can be followed by bonding second multi-level metallization layer 105 and ASIC 106 to multi-level metallization layer 104, as shown in FIG. 25.

Figure 26:
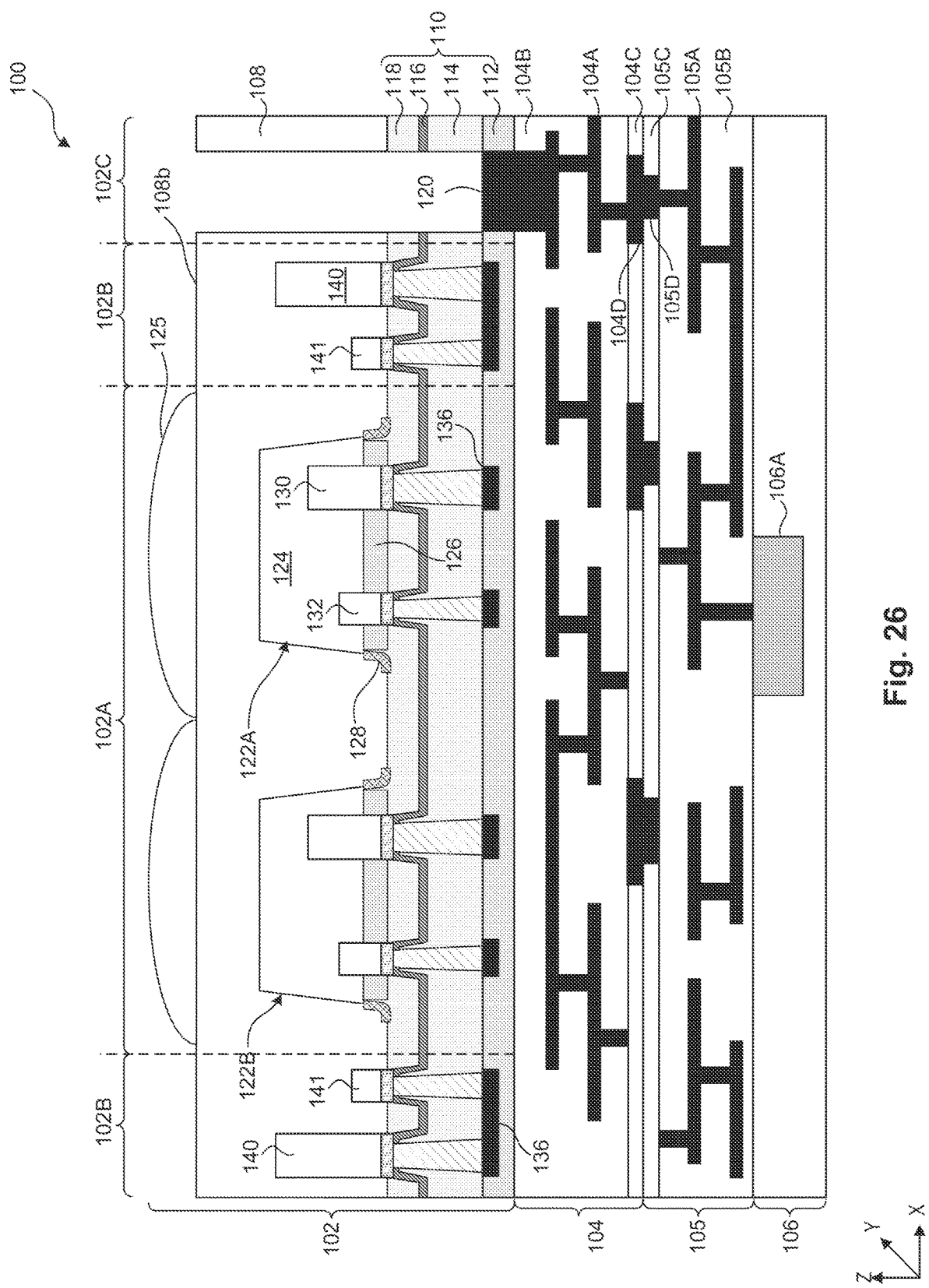

Referring to FIG. 2, in operation 240, a pad structure is formed on the multi-level metallization layer through a back side surface of the substrate. For example, as shown in FIG. 26, pad structure 120 is formed on multi-level interconnect structure 104A through back side surface 108b. The formation of pad structure 120 can include sequential operations of (i) forming a pad opening (not shown) within substrate 108, dielectric layer 118, ESL 116, ILD layer 114, passivation layer 112, and a portion of IMD layer 104B, (ii) depositing a conductive layer (not shown) within the pad opening, and (iii) patterning and etching the conductive layer to form pad structure 120 within pad opening, as shown in FIG. 26. Following the formation of pad structure 120, an array of microlens 125 can be formed on back side surface 108b.

Figure 27:
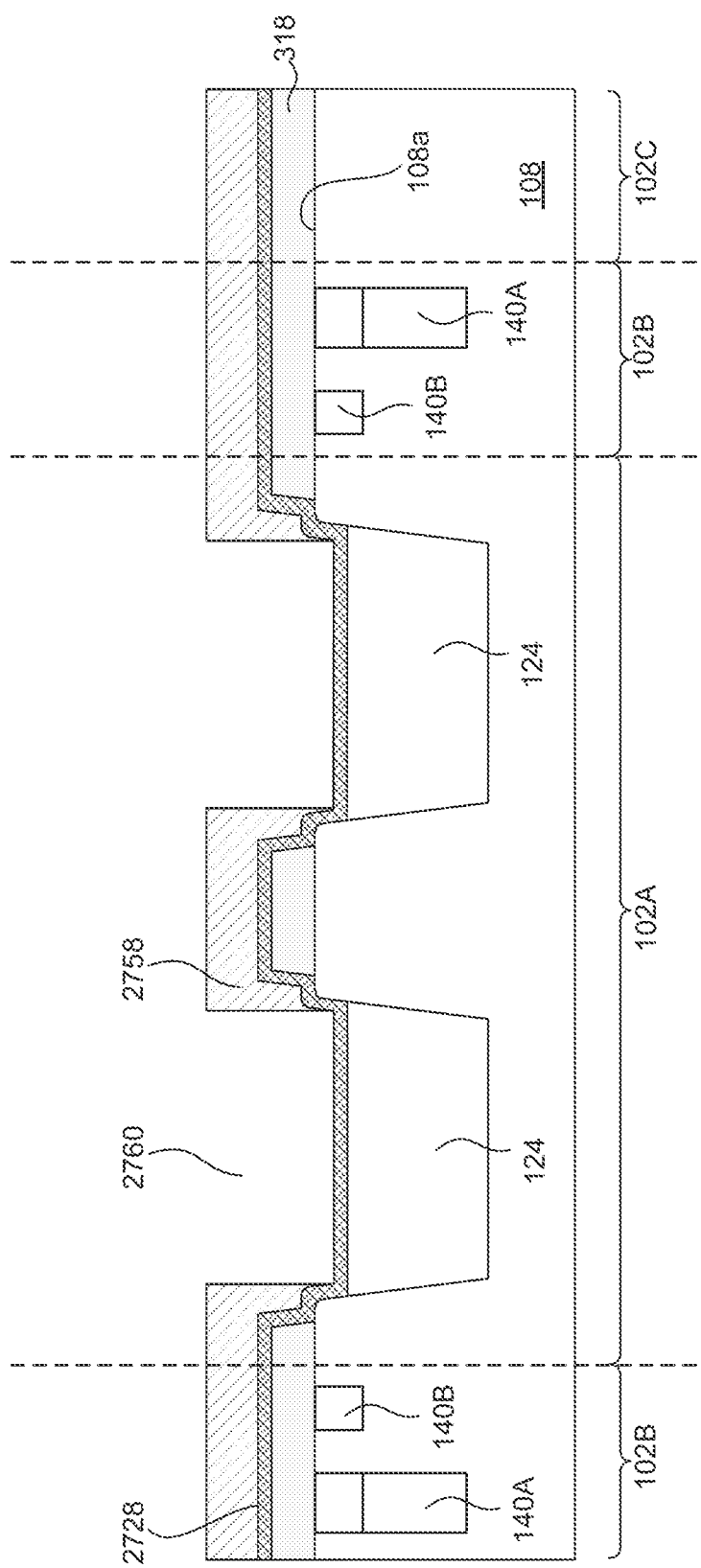
Figure 28:
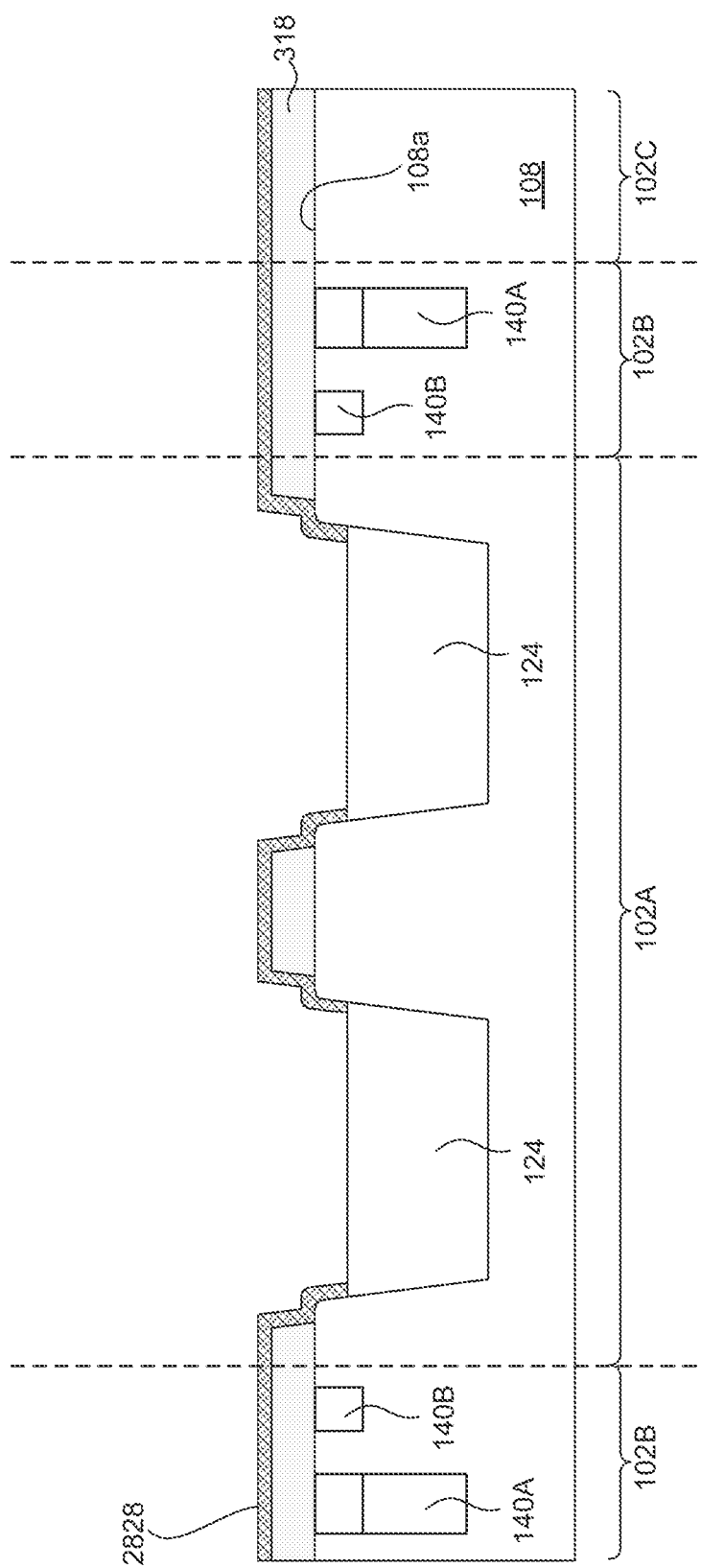

In some embodiments, in operation 215 of FIG. 2, instead of the oxidation process described to form barrier layers 128 with reference to FIG. 10, barrier layers 128 can be formed as described with reference to FIGS. 27-29. The formation of barrier layers 128 can include the sequential operations of (i) depositing an oxide layer 2728 on the structure of FIG. 9, as shown in FIG. 27, (ii) forming a patterned masking layer 2758 with openings 2760 on oxide layer 2728, as shown in FIG. 27, (iii) etching the portions of oxide layer 2728 exposed through openings 2760 to form etched oxide layer 2828, as shown in FIG. 28, (iv) removing patterned masking layer 2758 to form the structure of FIG. 28, and (v) etching the portions of oxide layer 2828 on dielectric layer 318 to form the structure of FIG. 29 on which operations 220-240 can be performed. In some embodiments, oxide layer 2728 can include an insulating material and can be deposited with a CVD process, an ALD process, or a suitable deposition process for depositing dielectric materials. In some embodiments, the etching of oxide layers 2728 and 2828 can be performed using a wet etch process (e.g., using DHF) or a dry etch process. Following the formation of barrier layers 128, an annealing process can be performed on the structure of FIG. 29 at a temperature of about 500° C. to about 800° C. in a hydrogen ambient.

Figure 34:
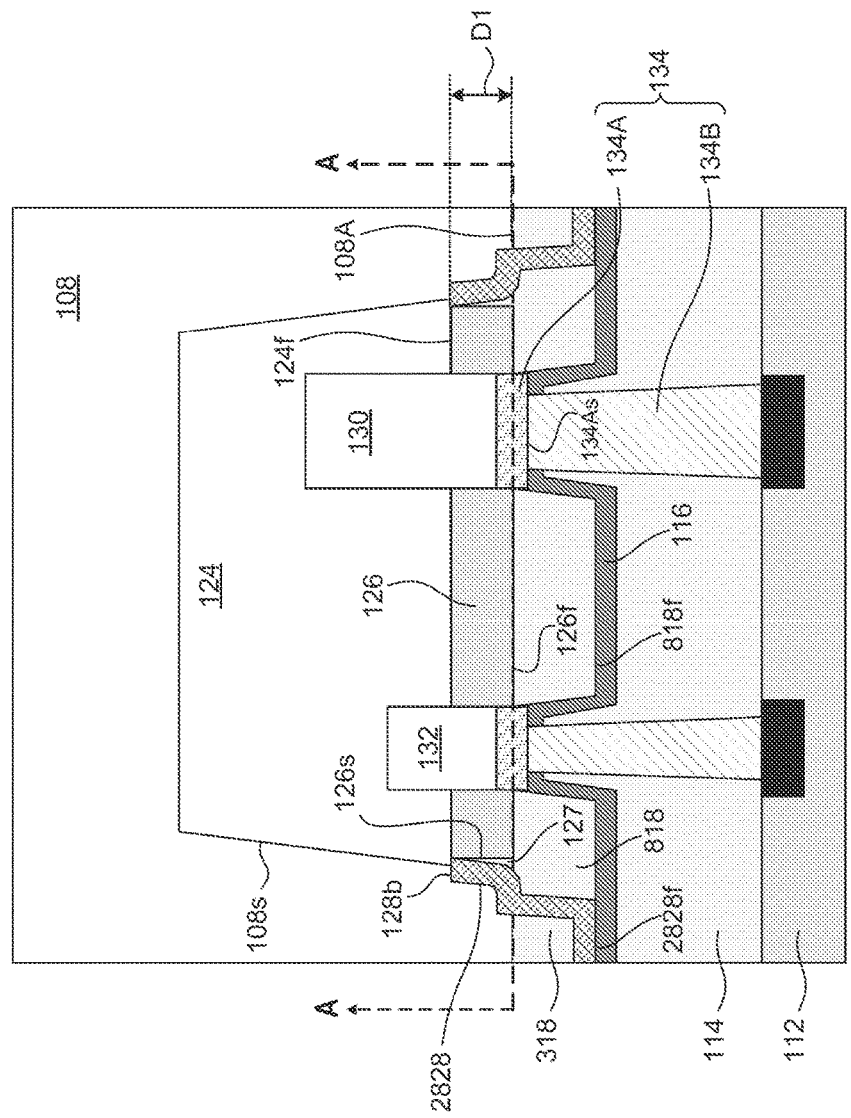
Figure 35:
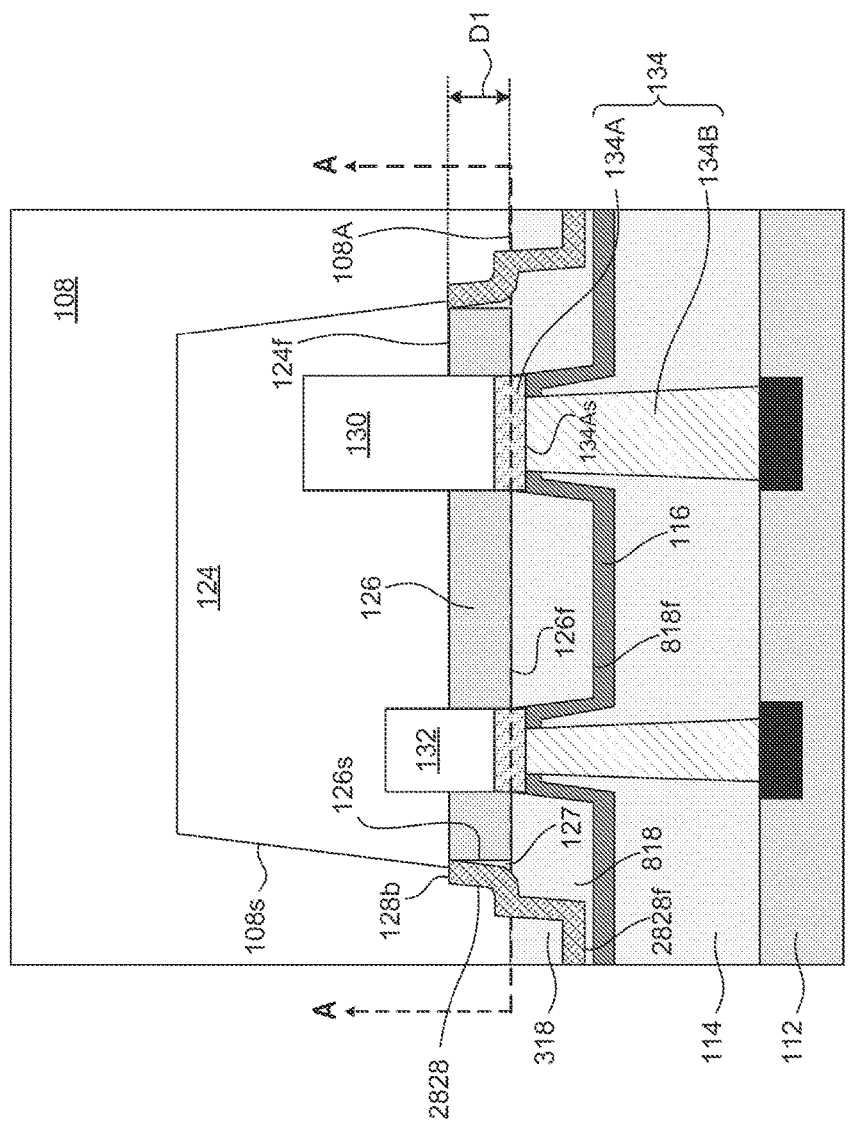

In some embodiments, the etching of the portions of oxide layer 2828 on dielectric layer 318 is not performed, and as a result, the structure of FIG. 29 is not formed and operations 220-240 are performed on the structure of FIG. 28. Performing operations 220-240 on the structure of FIG. 28 can result in region 102A1 having oxide layer 2828 as the barrier layer, as shown in FIG. 34, instead of barrier layer 128, as shown in FIG. 1B. In some embodiments, dielectric layer 818 that is formed in operation 220 can be formed with a front side surface 818f substantially coplanar with a front side surface 2828f of dielectric layer 2828, as shown in FIG. 34, or can be formed on front side surface 2828f, as shown in FIG. 35.

In some embodiments, in operation 215 of FIG. 2, instead of the oxidation process described to form barrier layers 128 with reference to FIG. 10, barrier layers 128 can be formed as described with reference to FIGS. 30-33. The formation of barrier layers 128 can include the sequential operations of (i) forming a patterned masking layer 3060 with openings 3062 on the structure of FIG. 9 to form the structure of FIG. 30, (ii) depositing an oxide layer 3128 on the structure of FIG. 30 to form the structure of FIG. 31, (iii) performing a lift-off process to remove patterned masking layer 3060 and portions of oxide layer 3128 on patterned masking layer 3060 to form oxide layer 3228 of FIG. 32, and (iv) etching portions of oxide layer 3228 on sidewalls of dielectric layer 318 to form the structure of FIG. 33 on which operations 220-240 can be performed. In some embodiments, oxide layer 3128 can include an insulating material and can be deposited with a CVD process, an ALD process, or a suitable deposition process for depositing dielectric materials. In some embodiments, the etching of oxide layer 3228 can be performed using a wet etch process (e.g., using DHF) or a dry etch process. Following the formation of barrier layers 128, an annealing process can be performed on the structure of FIG. 33 at a temperature of about 500° C. to about 800° C. in a hydrogen ambient.

Figure 32:
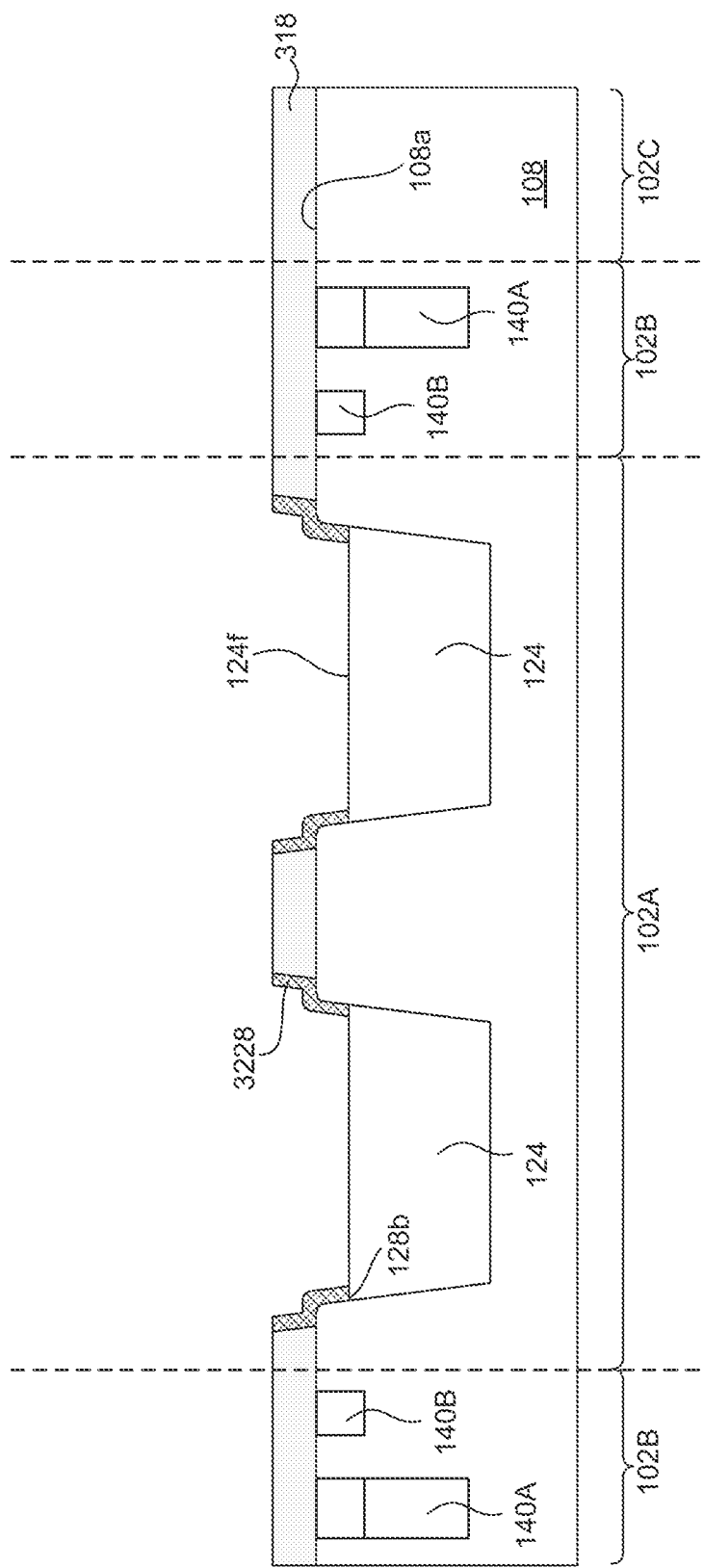
Figure 36:
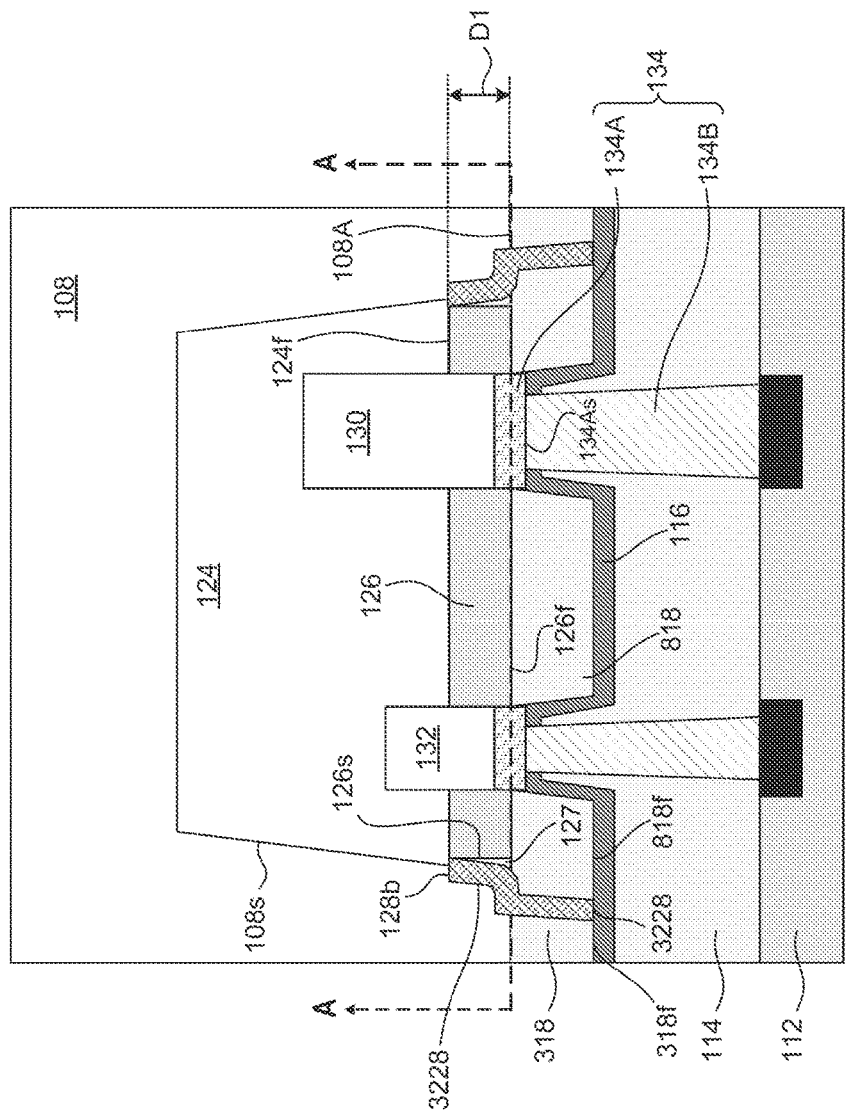
Figure 37:
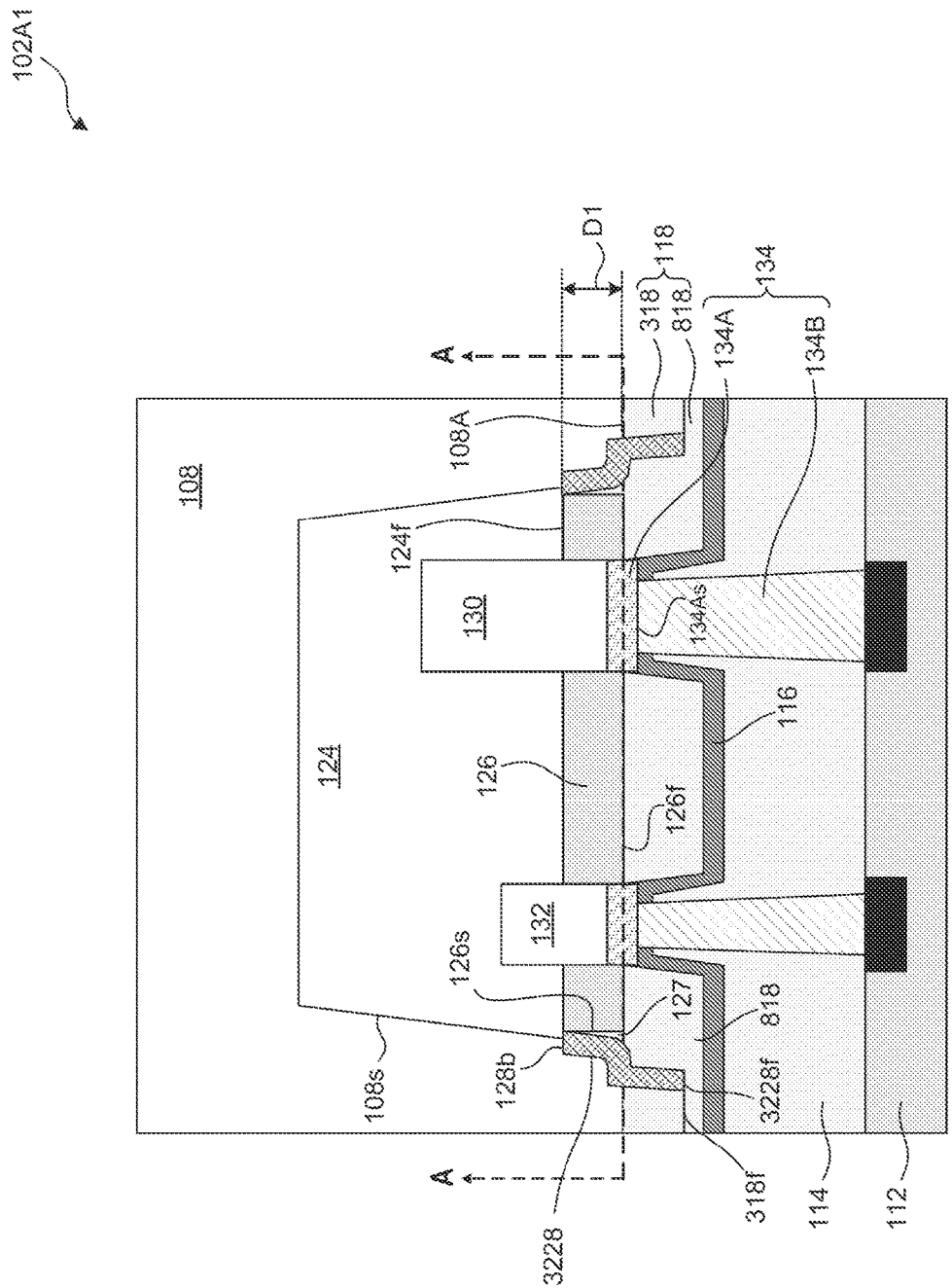

In some embodiments, the etching of the portions of oxide layer 3228 on sidewalls of dielectric layer 318 is not performed, and as a result, the structure of FIG. 33 is not formed and operations 220-240 are performed on the structure of FIG. 32. Performing operations 220-240 on the structure of FIG. 32 can result in region 102A1 having oxide layer 3228 as the barrier layer, as shown in FIG. 36, instead of barrier layer 128, as shown in FIG. 1B. In some embodiments, dielectric layer 818 that is formed in operation 220 can be formed with a front side surface 818f substantially coplanar with a front side surface 3228f of dielectric layer 3228 and a front side surface 318f of dielectric layer 318, as shown in FIG. 36, or can be formed on front side surfaces 3228f and 318f, as shown in FIG. 37.

The present disclosure provides example methods of fabricating BSI image sensors (e.g., BSI image sensor 102) with improved surface uniformity of Ge or SiGe epitaxial structures (e.g., epitaxial structure 124) in pixel structures (e.g. pixel structure 122A-122). In some embodiments, the example methods (e.g., method 200) form barrier layers (e.g., barrier layer 128) at the edges of the trenches (e.g., trench edge 108e) in which the Ge or SiGe epitaxial structures are formed. The barrier layers can prevent the formation of Ge or SiGe layers at the trench edges because the barrier layers include dielectric materials, such as silicon oxide ($SiO_x$), that are not favorable for the growth of Ge or SiGe layers. The materials of the barrier layers can inhibit the growth of Ge or SiGe layers on the barrier layers, and as a result, inhibits the growth of Ge or SiGe layers at the trench edges. Preventing the lateral expansion of the materials of the Ge or SiGe epitaxial structures can prevent the formation of recesses on the surfaces of the Ge or SiGe epitaxial structures.

Thus, the barrier layers at the trench edges can minimize or eliminate surface non-uniformity, and consequently reduce or eliminate the formation of non-uniform interfaces between the Ge or SiGe epitaxial structures and silicon capping layers (e.g., capping layer 126). In some embodiments, the surface non-uniformity in the Ge or SiGe epitaxial structures is reduced by about 50% to about 100% compared to epitaxial structures in BSI image sensors without the barrier layers. As a result, the sensor performance of the BSI image sensors with the barrier layers is increased by about 40% to about 60% compared to BSI image sensors without the barrier layers at the trench edges.

In some embodiments, a method includes depositing a dielectric layer on a substrate, forming a trench within the dielectric layer and the substrate, forming an epitaxial structure within the trench, and forming a barrier layer with first and second layer portions. The first layer portion is formed on a sidewall portion of the trench that is not covered by the epitaxial structure. The method further includes forming a capping layer on the epitaxial structure and adjacent to the barrier layer, selectively doping regions of the epitaxial structure and the capping layer, selectively forming a silicide layer on the doped regions, depositing an etch stop layer on the silicide layer, and forming conductive plugs on the silicide layer through the etch stop layer.

In some embodiments, a method includes depositing a dielectric layer on a substrate, forming an epitaxial structure within the substrate, depositing a semiconductor layer on the dielectric layer, the epitaxial structure, and a substrate region between the dielectric layer and the epitaxial structure, etching portions of the semiconductor layer from the dielectric layer and the epitaxial structure to form a barrier layer including a portion of the semiconductor layer on the substrate region, forming a capping layer on the epitaxial structure and adjacent to the barrier layer, selectively doping regions of the epitaxial structure and the capping layer, and forming contact structures on the doped regions.

In some embodiments, a semiconductor device includes a substrate, a dielectric layer disposed on the substrate, and a pixel region with a pixel structure. The pixel structure includes an epitaxial structure disposed within the substrate, a capping layer disposed on the epitaxial structure, and a barrier layer disposed on a substrate region of the substrate adjacent to and surrounding the epitaxial structure. The barrier layer includes an oxide of a material of the substrate. The semiconductor device further includes an isolation region with an isolation structure disposed adjacent to the pixel region and a contact pad region with a pad structure disposed adjacent to the isolation region.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate comprising a top sidewall portion and a bottom sidewall portion;
a dielectric layer disposed on the substrate;
a pixel region comprising a pixel structure, wherein the pixel structure comprises:
an epitaxial structure disposed in the substrate, wherein a sidewall of the epitaxial structure is in physical contact with the bottom sidewall portion of the substrate;
a capping layer disposed on a top surface of the epitaxial structure; and
a barrier layer surrounding the capping layer and disposed on and in physical contact with a substrate region of the substrate that extends above the top surface of the epitaxial structure, wherein the barrier layer comprises an oxide of a material of the substrate region;
an isolation region comprising an isolation structure disposed adjacent to the pixel region; and
a contact pad region comprising a pad structure disposed adjacent to the isolation region.

2. The semiconductor device of claim 1, wherein a sidewall of the capping layer is spaced apart from a sidewall of the barrier layer by a portion of the dielectric layer.

3. The semiconductor device of claim 1, wherein a first sidewall portion of the capping layer is in contact with the barrier layer and a second sidewall portion of the capping layer is in contact with the dielectric layer.

4. The semiconductor device of claim 1, wherein the substrate region comprises the top sidewall portion of the substrate in physical contact with the barrier layer.

5. The semiconductor device of claim 1, wherein the substrate region comprises a surface portion of the substrate in contact with the dielectric layer.

6. The semiconductor device of claim 1, wherein the pixel structure further comprises doped regions disposed in the capping layer and the epitaxial structure.

7. The semiconductor device of claim 1, wherein a first portion of the barrier layer extends along a sidewall of the substrate region and a second portion of the barrier layer extends along a front side surface of the substrate region.

8. The semiconductor device of claim 1, wherein the dielectric layer is in contact with a front side surface of the capping layer.

9. The semiconductor device of claim 1, wherein the dielectric layer is in contact with a front side surface of the barrier layer.

10. A semiconductor device, comprising:
a substrate;
a pixel structure, comprising:
a germanium-based epitaxial region disposed in the substrate, wherein sidewalls of the germanium-based epitaxial region is in physical contact with sidewalls of the substrate and wherein a top surface of the germanium-based epitaxial region is below a top surface of the substrate;
a capping layer disposed on the top surface of the germanium-based epitaxial region; and
an oxide layer surrounding the capping layer; and
a doped isolation structure disposed adjacent to the pixel structure.

11. The semiconductor device of claim 10, wherein the germanium-based epitaxial region comprises a silicon germanium region or a germanium region.

12. The semiconductor device of claim 10, wherein the capping layer comprises a silicon layer.

13. The semiconductor device of claim 10, wherein the oxide layer is disposed between a sidewall of the capping layer and a sidewall of the substrate.

14. The semiconductor device of claim 10, wherein the oxide layer extends from a top surface of the substrate to a sidewall surface of the substrate.

15. The semiconductor device of claim 10, wherein a top surface of the oxide layer extends above top surfaces of the substrate and the capping layer.

16. The semiconductor device of claim 10, wherein the pixel structure further comprises:
   a p-type doped region disposed in the capping layer; and
   an n-type doped region disposed in the capping layer.

17. A semiconductor device, comprising:
   a substrate;
   a dielectric layer disposed on the substrate;
   an epitaxial structure disposed in the substrate;
   a barrier layer disposed on a substrate region between the dielectric layer and a top surface of the epitaxial structure, wherein the substrate region extends above a top surface of the epitaxial structure; and
   a capping layer disposed on the top surface of the epitaxial structure, wherein a sidewall of the capping layer is spaced apart from a sidewall of the barrier layer by a portion of the dielectric layer.

18. The semiconductor device of claim 17, wherein the capping layer comprises a silicon layer.

19. The semiconductor device of claim 17, wherein the epitaxial structure comprises a silicon germanium region or an undoped germanium region.

20. The semiconductor device of claim 17, wherein the barrier layer surrounds the capping layer.

\* \* \* \* \*